(12) United States Patent
Giannakis et al.

(10) Patent No.: US 7,522,673 B2
(45) Date of Patent: Apr. 21, 2009

(54) SPACE-TIME CODING USING ESTIMATED CHANNEL INFORMATION

(75) Inventors: Georgios B. Giannakis, Minnetonka, MN (US); Shengli Zhou, St. Paul, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 1364 days.

(21) Appl. No.: 10/420,351

(22) Filed: Apr. 21, 2003

(65) Prior Publication Data

US 2004/0066761 A1    Apr. 8, 2004

Related U.S. Application Data

(60) Provisional application No. 60/374,886, filed on Apr. 22, 2002, provisional application No. 60/374,935, filed on Apr. 22, 2002, provisional application No. 60/374,934, filed on Apr. 22, 2002, provisional application No. 60/374,981, filed on Apr. 22, 2002, provisional application No. 60/374,933, filed on Apr. 22, 2002.

(51) Int. Cl.
   *H04B 7/02* (2006.01)
(52) U.S. Cl. .................................... 375/267
(58) Field of Classification Search ................ 375/260, 375/267; 370/208, 210
   See application file for complete search history.

(56) References Cited

U.S. PATENT DOCUMENTS

| | | | |
|---|---|---|---|
| 6,188,717 B1 | 2/2001 | Kaiser et al. | |
| 6,891,897 B1 | 5/2005 | Bevan et al. | |
| 6,898,248 B1 | 5/2005 | Elgamal et al. | |
| 2001/0033622 A1* | 10/2001 | Jongren et al. | 375/267 |
| 2002/0122381 A1* | 9/2002 | Wu et al. | 370/208 |
| 2002/0167962 A1 | 11/2002 | Kowalski | |
| 2002/0196842 A1* | 12/2002 | Onggosanusi et al. | 375/148 |
| 2003/0035491 A1* | 2/2003 | Walton et al. | 375/267 |
| 2004/0146014 A1 | 7/2004 | Hammons, Jr. et al. | |

OTHER PUBLICATIONS

A. Aggarwal, S. Savage, and T. Anderson, "Understanding the Performance of TCP Pacing." in Proc. Of IEEE Infocom 00, Tel-Aviv, Israel, Mar. 2000.

D. Agrawal, V. Tarokh, A. Naguib, and N. Seshadri, "Space-Time Coded OFDM for High Data-Rate Wireless Communication Over Wideband Channels," Proc. Of Vehicular Technology Conf., pp. 2232-2236, Ottawa, Ont, Canada, May 18-21, 1998.

N. Al-Dahahir, "Single-Carrier Frequency-Domain Equalization for Space-Time Block-Coded Transmissions over Frequency-Selective Fading Channels," IEEE Communications Letters, vol. 5, No. 7, pp. 304-306, Jul. 2001.

(Continued)

*Primary Examiner*—Don N Vo
(74) *Attorney, Agent, or Firm*—Shumaker & Sieffert, P.A.

(57) ABSTRACT

The invention is directed to techniques for space-time coding in a wireless communication system in which the transmitter makes use of multiple transmit antennas. The transmitter uses channel information estimated by a receiving device and returned to the transmitter, e.g., as feedback. In one exemplary embodiment, the transmitter receives a mean feedback information that defines a mean channel value associated with the different channels of the different antennas. In another exemplary embodiment, the transmitter receives covariance feedback, e.g., statistical values associated with each of the different channels.

44 Claims, 16 Drawing Sheets

OTHER PUBLICATIONS

N. Al-Dhahir and A.H. Sayed, "The Finite-Length Multi-Input Multi-Output MMSE-DFE," IEEE Trans. On Signal Processing, vol. 48, No. 10, pp. 1-38, Oct. 2000.

S.L. Ariyavistakul, "Turbo Space-Time Processing to Improve Wireless Channel Capacity," IEEE Trans. On Communications, vol. 48, No. 8, pp. 1347-1359, Aug. 2000.

S. Barbarossa and F. Cerquetti, "Simple Space-Time Coded SS-CDMA Systems Capable of Perfect MUI/ISI Elimination," IEEE Communications Letters, vol. 5, No. 12, pp. 471-473, Dec. 2001.

S. Benedetto, G. Montorsi, D. Divsalar, and F. Pollara, "A Soft-Input Soft-Output Maximum A Posterior (MAP) Module to Decode Parallel and Serial Concatenated Codes," TDA Progress Report, vol. 42-127, Nov. 15, 1996, downloadable from http://tmo.jpl.nasa.gov/tmo/progress_report/index.html.

C. Berrou, A. Glavieux, and P. Thitimajsima, "Near Shannon Limit Error-Correcting Coding and Decoding: Turbo Codes (1)," in Proc. Of Intl. Conf. On Com., Geneva, Switzerland, May 1993, pp. 1064-1070.

S. Bhashyam, A.M. Sayeed, and B. Aazhang, "Time-Selective Signaling and Reception for Communication over Multipath Fading Channels," IEEE Trans. On Communications, vol. 48, No. 1, pp. 1-34, Jan. 2000.

E. Biglieri, J. Proakis, and S. Shamai, "Fading Channels: Information-Theoretic and Communications Aspects," IEEE Trans. On Information Theory, vol. 44, No. 6, pp. 2619-2692, Oct. 1998.

J. Boutros and E. Viterbo, "Signal Space Diversity: A Power-and Bandwidth-Efficient Diversity Technique for the Rayleigh Fading Channel," IEEE Transactions on Information Theory, vol. 44, No. 4, pp. 1453-1467, Jul. 1998.

H. Bolcskei and A.J. Paulraj, "Space-Frequency Codes for Broadband Fading Channels," in Proc. of IEEE Int. Symposium on Information Theory, pp. 219, Washington D.C., Jun. 24-29, 2001.

H. Bolcskei and A.J. Paulraj, "Space-Frequency Coded Broadband OFDM Systems," in Proc. of Wireless Communications and Networking Conference, vol. 1, pp. 1-6, Chicago, IL, Sep. 23-28, 2000.

D.K. Borah and B. Hart, "Receiver Structures for Time-Varying Frequency-Selective Fading Channels," IEEE Journal on Selected Areas in Communications, vol. 17, No. 11, pp. 1863-1875, Nov. 1999.

J.K. Cavers, "Optimized Use of Diversity Modes In Transmitter Diversity Systems," in Proc. of the Vehicular Technology Conf., vol. 3, Amsterdam, The Netherlands, 1999, pp. 1768-1773.

D. Dardari, and V. Tralli, "High-Speed Indoor Wireless Communications at 60 GHz with Coded OFDM," IEEE Transactions on Communications, vol. 47, No. 11, pp. 1709-1721, Nov. 1999.

V.M. DaSilva and E. S. Sousa, "Fading-Resistant Modulation Using Several Transmitter Antennas," IEEE Transactions on Communications, vol. 45, No. 10, pp. 1236-1244, Oct. 1997.

A. Duel-Hallen, S. Hu, and H. Hallen, "Long-Range Prediction of Fading Signals," IEEE Signal Processing Magazine, pp. 62-75, May 2000.

S. Floyd, M. Handley, J. Padhye, and J. Widmer, "Equation-Based Congestion Control for Unicast Applications," in Proc. Of SIGCOMM'00.

G.J. Foschini and M.J. Gans, "On Limits of Wireless Communications in a Fading Environment When Using Multiple Antennas," Wireless Personal Communications, vol. 6, No. 3, pp. 311-335, Mar. 1998.

G.B. Giannakis, X. Ma, G. Leus, and S. Zhou, "Space-Time-Doppler Coding Over Time-Selective Fading Channels With Maximum Diversity And Coding Gains," Proc. Of Intl. Conf. On ASSP, Orlando, FL, May 13-17, 2002, pp. III-2217-III-2220.

G.B. Giannakis and S. Zhou, "Optimal Transmit-Diversity Precoders for Random Fading Channels," in Proc. of Globecom Conf., vol. 3, San Francisco, CA, Nov. 27-Dec. 1, 2000.

G.B. Giannakis and C. Tepedelenlioglu, "Basis Expansion Models and Diversity Techniques for Blind Identification and Equalization of Time-Varying Channels," Proceedings of the IEEE, vol. 86, No. 10,pp. 1969-1986, Oct. 1998.

X. Giraud, E. Boutillon, and J.C. Belfiore, "Algebraic Tools to Build Modulation Schemes for Fading Channels," IEEE Transactions on Information Theory, vol. 43, pp. 938-952, May 1997.

D. Gore, S. Sandhu, and A. Paulraj, "Delay Diversity Code for Frequency Selective Channels," Electronics Letters, vol. 37, No. 20, pp. 1230-1231, Sep.27, 2001.

J. Hagenauer, and P. Hoeher, "A Viterbi Algorithm with Soft-Decision Outputs and Its Applications," in Proc. Of the IEEE 1989 Global Communications Conference, Dallas, Texas, pp. 1680-1686, Nov. 1989.

B. Hassibi and B.M. Hochwald, "High-Rate Codes that are Linear in Space and Time," IEEE Trans. On Information Theory, pp. 1-56, revised Apr. 2001; URL: http://mars.bell-labs.com/cm/ms/what/mars/index.html.

A. Hiroike, F. Adachi, and N. Nakajima, "Combined Effects of Phase Sweeping Transmitter Diversity and Channel Coding," IEEE Trans. On Vehicular Technology, pp. 170-176, May 1992.

R. Hoshyar, S.H. Jamali, and A.R.S. Bahai, "Turbo Coding Performance in OFDM Packet Transmissions," in Proc. IEEE VTC, Tockyo, Japan, 2000, vol. 2, pp. 805-810.

S.A. Jafar, S. Vishwanath, and A. Goldsmith, "Channel Capacity and Beamforming for Multiple Transmit and Receive Antennas with Covariance Feedback," in Proc. of International Conference on Communications, vol. 7, Helsinki, Finland, Jun. 2001.

G. Jongren, M. Skoglund, and B. Ottersten, "Combining Transmit Beamforming and Orthogonal Space-Time Block Codes by Utilizing Side Information," IEEE Sensor Array and Multichannel Signal Processing Workshop, Mar. 14, 2000.

G. Jongren, M. Skoglund, and B. Ottersten, "Combining Transmit Antenna Weights and Orthogonal Space-Time Block Codes by Utilizing Side Information," In Proceedings of the 33rd Asilomar Conference on Signals, Systems and Computers, Oct. 23, 1999.

G. Jongren and M. Skoglund, "Utilizing Quantized Feedback Information in Orthogonal Space-Time Block Coding," in Proceedings IEEE Global Telecommunications Conference, Nov. 27, 2000.

G. Kaplan and S. Shamai, "Achievable Performance Over the Correlated Rician Channel," IEEE Transactions on Communications, vol. 42, No. 11, pp. 2967-2978, Nov. 1994.

W.-Y. Kuo and M.P. Fitz, "Design and Analysis of Transmitter Diversity Using Intentional Frequency Offset for Wireless Communications," IEEE Trans. On Vehicular Technology, vol. 46, No. 4, pp. 871-881, Nov. 1997.

B. Le Floch, M. Alard, and C. Berrou, "Coded Orthogonal Frequency Division Multiplex," Proceedings of the IEEE, vol. 83, No. 6, pp. 982-996, Jun. 1995.

G. Leus, S. Zhou, and G.B. Giannakis, "Multi-User Spreading Codes Retaining Orthagonality through Unknown Time- and Frequency-Selective Fading," Proc. Of GLOBECOM, vol. 1, pp. 259-263, San Antonio, TX, Nov. 25-29, 2001.

Y. Li, "Simplified Channel Estimation for OFDM Systems With Multiple Transmit Antennas," IEEE Transactions On Wireless Communications, vol. 1, No. 1, pp. 67-75, Jan. 2002.

E. Lindskog and A. Paulraj, "A Transmit Diversity Scheme for Channels with Intersymbol Interference," Proceedings Of International Conference On Comm., vol. 1, pp. 307-311, Jun. 2000.

Y. Liu, M. P. Fitz, and O. Y. Takeshita, "Space-Time Codes Performance Criteria and Design for Frequency Selective Fading Channels," Proc. Of International Conference on Comm., Helsinki, Finland, Jun. 11-15, 2001.

Z. Liu, Y. Xin, and G.B. Giannakis, "Linear Constellation Precoding for OFDMW With Maximum Multipath Diversity and Coding Gains," IEEE Transactions On Communications, vol. 51, No. 3 , pp. 416-427, Mar. 2003.

Z. Liu, Y. Xin, and G.B. Giannakis, "Space-Time-Frequency Coded OFDM Over Frequency-Selective Fading Channels," IEEE Transactions on Signal Processing, vol. 50, No. 10, pp. 2465-2476, Oct. 2002.

Z. Liu, Y. Xin, and G.B. Giannakis, "Space-Time-Frequency Trellis Coding for Frequency-Selective Fading Channels", pp. 145-149, 2002.

Z. Liu, Y. Xin, and G.B. Giannakis, "Space-Time-Frequency Block Coded OFDM with Subcarrier Grouping and Constellation Precoding," Proc. Of Intl. Conf. on ASSP, Orlando, FL, May 13-17, 2003, pp. III-2205-III-208.

B. Lu and X. Wang, "Space-Time Code Design in OFDM Systems," Proc. Of Global Telecommunications Conferences, San Francisco, CA, vol. 2, pp. 1000-1004, Nov. 27-Dec. 1, 2000.

X. Ma and G.B. Giannakis, "Space-Time Coding for Doubly-Selective Channels," Proc. Of Intl. Conf. On Circuits and Systems, Scottsdale, AZ, May 25-29, 2002, pp. III-647-III-650.

X. Ma and G.B. Giannakis, "Maximum-Diversity Transmissions over Time-Selective Wireless Channels," Proc. of Wireless Communications and Networking Conf., Orlando, FL, Mar. 17-21, 2002, pp. 497-501.

X. Ma and G.B. Giannakis, "Maximum-Diversity Transmissions Over Doubly Selective Wireless Channels," IEEE Transactions On Informormation Theory, vol. 49, No. 7, pp. 1832-1840, Jul. 2003.

X. Ma, C. Tepedelenlioglu, G.B. Giannakis, and S. Barbarossa, "Non-Data-Aided Carrier Offset Estimators for OFDM With Null Subcarriers: Identifiability, Algorithms, and Performance," IEEE Journal on Selected Areas in Communications, vol. 19, No. 12, pp. 2504-2515, Dec. 2001.

J. Mahdavi and S. Floyd, "TCP-Friendly Unicast Rate-Based Flow Control," Jan. 1997, http://www.psc.edu/networking/papers/tcp_friendly.html.

M. Martone, "Wavelet-Based Separating Kerneles for Sequence Estimation with Unknown Rapidly Time-Varying Channels," IEEE Communications Letters, vol. 3, No. 3, pp. 78-80, Mar. 1999.

M. Mathis, J. Semke, J. Mahdavi, and T. Ott, "The Macroscopic Behavior of the TCP Congestion Avoidance Algorithm," Computer Communication Review, Vo. 27 No. 3, Jul. 1997, pp. 1-16.

B. Muquet, M. de Courville, G.B. Giannakis, Z. Wang, and P. Duhamel, "Reduced Complexity Equalizers For Zero-Padded OFDM Transmissions".

A.F. Naguib, "On The Matched Filter Bound of Transmit Diversity Techniques," IEEE International Conference on Communications, vol. 2, pp. 596-603, Helsinki, Finland, Jun. 11-14, 2001.

A. Narula, M.J. Lopez, M.D. Trott, and G.W. Wornell, "Efficient Use of Side Information in Multiple-Antenna Data Transmission over Fading Channels," IEEE Journal on Selected Areas In Communications, vol. 16, No.8, pp. 1423-1436, Oct. 1998.

A. Narula, M.D. Trott, and G.W. Wornell, "Performance Limits of Coded Diversity Methods for Transmitter Antenna Arrays," IEEE Transactions On Information Theory, vol. 45, No. 7, pp. 2418-2433, Nov. 1999.

S. Ohno and G.B. Giannakis, "Optimal Training and Redundant Precoding for Block Transmissions With Application to Wireless OFDM," IEEE Transaction on Communications, vol. 50, No. 12, pp. 2113-2123, Dec. 2002.

M.F. Pop and N.C. Beaulieu, "Limitations of Sum-of-Sinusoids Fading Channel Simulators," IEEE Transactions On Communications, vol. 49, No. 4, pp. 699-708, Apr. 2001.

R. Rajaie, H. Yu, M. Handely, and D. Estrin, "Multimedia Proxy Caching Mechanism for Quality Adaptive Streaming Applications in the Internet," Technical report 99-709, Computer Science Department, USC.

R. Rajaie, M. Handely, and D. Estrin, "Quality Adapation for Congestion Controlled Video Playback over the Internet," in Proc of SIGCOMM'99, pp. 1-16.

S. Sen, J. Rexford, and D. Towsley, "Proxy Prefix Caching for Multimedia Streams," in Proc. of IEEE INFOCOM'99.

L. Rizzo, IP Dummynet, pp. 1-9, http://info.iet.unipi.it/luigi/ip_dummynet/.

O. Rose, "Statistical Properties of MPEG Video Traffic and Their Impact on Traffic Modeling in ATM Network," TR-101, Institute of Computer Science, University of Wurzburg, Germany, Feb. 1995, pp. 1-25.

M. Rouanne and D.J. Costello, Jr., "An Algorithm for Computing the Distance Spectrum of Trellis Codes," IEEE Journal on Selected Areas in Communications, vols. 7, No. 6, pp. 929-940, Aug. 1989.

A. Ruiz, J.M. Cioffi, and S. Kasturia, "Discrete Multiple Tone Modulation with Coset Coding for the Spectrally Shaped Channel," IEEE Transactions on Communications, vol. 40, No. 6, pp. 1012-1029, Jun. 1992.

H.R. Sadjadpour, "Application of Turbo Codes for Discrete Multi-Tone Modulation Schemes," in Proc. Of Intl. Conf. On Com., Vancouver, Canada, 1999, vol. 2, pp. 1022-1027.

A.M. Sayeed and B. Aazhang, "Joint Multipath-Doppler Diversity in Mobile Wireless Communications," IEEE Transactions On Communications, vol. 47, No. 1, pp. 123-132, Jan. 1999.

D.-S. Shiu, G.J. Foschini, M.J. Gans, and J.M. Kahn, "Fading Correlation and Its Effect on the Capacity of Multielement Antenna Systems," IEEE Transactions on Communications, vol. 48; No. 3, pp. 502-513, Mar. 2000.

A. Stamoulis, G.B. Giannakis, and A. Scaglione, "Block FIR Decision-Feedback Equalizers for Filterbank Precoded Transmissions with Blind Channel Estimation Capabilities," IEEE Transactions On Communications, vol. 49, No. 1, pp. 69-83, Jan. 2001.

L. Sylla, P. Fortier, and H.T. Huynh, "Performance of COFDM Using Turbo Codes," in Proc. Of IEEE Canadian Conference on Electrical and Computer Engineering, Edmonton, Alta, Canada, May 9-12, 1999.

V. Tarokh, H. Jafarkhani, and A.R. Calderbank, "Space-Time Block Codes from Orthogonal Designs," IEEE Transactions On Information Theory, vol. 45, No. 5, pp. 1456-1467, Jul. 1999.

C. Tepedelenlioglu and G.B. Giannakis, "Transmitter Redundancy for Blind Estimation and Equalization of Time- Frequency-Selective Channels," IEEE Transactions On Signal Processing, vol. 48, No. 7, pp. 2029-2043, Jul. 2000.

M.K. Tsatsanis and G.B. Giannakis, "Modelling and Equalization of Rapidly Fading Channels," International Journal of Adaptive Control and Signal Processing, vol. 10, pp. 159-176, 1996.

E. Visotsky and U. Madhow, "Space-Time Transmit Precoding With Imperfect Feedback," IEEE Transactions on Information Theory, vol. 47, No. 6, pp. 2632-2639, Sep. 2001.

A.J. Viterbi, "An Intuitive Justification and a Simplified Implementation of the MAP Decoder for Convolutional Codes," IEEE Journal on Selected Areas in Communications, vol. 16, No. 2, pp. 260-264, Feb. 1998.

E. Viterbo, and J. Boutros, "A Universal Lattice Code Decoder for Fading Channels," IEEE Transactions on Information Theory, vol. 45, no. pp. 1639-1642, Jul. 1999.

J. Vogt, K. Koora, A. Finger, and G. Fettweis, "Comparison of Different Turbo Decoder Realizations For IMT-2000," in Global Telecommunications Conference—GLOBECOM'99, Rio de Janeiro, Brazil, 1999, vol. 5, pp. 2704-2708.

F.W. Vook and T.A. Thomas, "Transmit Diversity Schemes for Broadband Mobile Communication Systems," Proc. Of Vehicular Tech. Conf., vol. 6, pp. 2523-2529, Boston MA, Sep. 24-28, 2000.

H. Wang, J. Belzile, and C.L. Despins, "64-QAM OFDM With TCM Coding and Waveform Shaping In A Time-Selective Rician Facing Channel," in Proc. Of Int'l Zurich Seminar on Broadband Comm., Berdun, Que., Canada, 2000, pp. 257-261.

X. Wang and H.V. Poor, "Iterative (Turbo) Soft Interface Cancellation and Decoding for Coded CDMA," IEEE Transactions on Communications, vol. 47, No. 7, pp. 1046-1061, Jul. 1999.

Y. Wang, Z.-L. Zhang, D. Du, and D. Su, "A Network-Conscious Approach to End-to-End Video Delivery Over Wide Area Networks Using Proxy Servers," in Proceedings of IEEE INFOCOM'98.

Z. Wang, S. Zhou, and G.B. Giannakis, "Joint Coding-Precoding with Low Complexity Turbo-Decoding," IEEE Transactions on Wireless Communications, vol. XXX, No. XXX, pp. 1-11, Month 2003; also in Proc. Of the European Wireless Conference, Florence, Italy, Feb. 25-28.

Z. Wang and G.B. Giannakis, "Lineraly Precoded or Coded OFDM against Wireless Channel Fades?" in Third IEEE Signal Processing Workshop on Signal Processing Advances in Wireless Communication, Taoyuan, Taiwan, Mar. 20-23, 2001.

Z. Wang and G.B. Giannakis, "Complex-Field Coding for OFDM Over Fading Wireless Channels" IEEE Transactions on Information Theory, vol. 49, No. 3, pp. 707-720, Mar. 2003.

Z. Wang and G.B. Giannakis, "Wireless Multicarrier Communications: Where Fourier Meets Shannon," IEEE Signal Processing Magazine, vol. 17, No. 3, pp. 29-48, May 2000.

A. Wittneben, "A New Bandwidth Efficient Transmit Antenna Modulation Diversity Scheme for Linear Digital Modulation," Proc. of IEEE International Conference on Comm., vol. 3, pp. 1630-1634, Geneva, Switzerland, May 23-26, 1993.

Y. Xin, Z. Wang, and G.B. Giannakis, "Space-Time Constellation-Rotating Codes Maximizing Diversity and Coding Gains," Proc. Of GLOBECOM, vol. 1, pp. 455-459 San Antonio, TX, Nov. 25-27, 2001.

Q. Yan and R.S. Blum, "Robust Space-Time Block Coding for Rapid Fading Channels," IEEE Global Telecommunications Conference, vol. 1, pp. 460-464, San Antonio, TX, Nov. 25-29, 2001.

Z.-L. Zhang, S. Nelakuditi, R. Aggarwal, and R. Tsang, "Efficient Selective Frame Discard Algorithms for Stored Video Delivery across Resource Constrained Networks," in Proc. of IEEE INFOCOM'99, pp. 1-26.

S. Zhou, G.B. Giannakis, and C. Le Martret "Chip-Interleaved Block-Spread Code Division Multiple Access," IEEE Transactions On Communications, vol. 50, No. 2, pp. 235-248, Feb. 2002.

S. Zhou and G.B. Giannakis, "Optimal Transmitter Eigen-Beamforming and Space-Time Block Coding Based on Channel Correlations," IEEE Trans. Signal processing, vol. 50, No. 10, pp. 553-557, Oct. 2002.

S. Zhou and G.B. Giannakis, "Space-Time Coding With Maximum Diversity Gains Over Frequency-Selective Fading Channels," IEEE Signal Processing Letters, vol. 8, No. 10, pp. 269-272, Oct. 2001.

S. Zhou, Z. Wang, N. Bapat, G.B. Giannakis, "Turbo Decoding of Error Control Coded and Unitary Precoded OFDM", pp. 1237-1241, University of Minnesota.

S. Zhou, B. Muquet, and G.B. Giannakis, "Subspace-Based (Semi-) Blind Channel Estimation for Block Precoded Space-Time OFDM," IEEE Transactions on Signal Processing, vol. 50, No. 5, pp. 1215-1228, May 2002.

W.W. Peterson et al., *Error-Correcting Codes*, Second Edition, MIT Press 1972, pp. 125, 129-131, 556.

G.C. Clark, Jr. et al., *Error-Correction Coding for Digital Communications*, Plenum Press, pp. 9, 10, 420.

K.R. Narayanan et al., "Low Complexity Turbo Equalization with Binary Precoding," 5 pages, IEEE, 2000.

* cited by examiner

Power loading based on Ricean and Nakagami distributions (QPSK)

- -o- Ricean based power loading, SER bound
- -□- Ricean based power loading, exact SER
- -•- Nakagami based power loading, exact SER SER versus $E_s/N_0$ ($p = 0.6$, $N_t = 4$, $N_r = 1$)

— 1D Beamforming, exact SER
— 2D Beamforming, exact SER
— Equal power loading, exact SER
— Optimal loading, exact SER SER versus $E_s/N_0$ ($p= 0.9$, $N_t = 4$, $N_r = 1$)

— ■ — 1D Beamforming, exact SER
— □ — 2D Beamforming, exact SER
— ○ — Equal power loading, exact SER
—— Optimal loading, exact SER SER versus $E_s/N_0$ ($p = 0.6$, $N_t = 4$, $N_r = 2$)

—✦— 1D Beamforming, exact SER
—□— 2D Beamforming, exact SER
—○— Equal power loading, exact SER
——— Optimal loading, exact SER SER versus $E_s/N_0$ ($p = 0.9$, $N_t = 4$, $N_r = 2$)

- — 1D Beamforming, exact SER
- — 2D Beamforming, exact SER
- — Equal power loading, exact SER
- —— Optimal loading, exact SER Optimal vs. equal power loading: Channel 1

—— Optimal loading, QPSK
—·— Optimal loading, 16-QAM
– – – Equal power loading
----- 1D beamforming SER vs SNR: Channel 1, QPSK

- ─✱─ 1D Beam forming, SER bound
- ─ ✱ ─ 1D Beam forming, exact SER
- ─ ○ ─ Equal power loading, SER bound
- ─○─ Equal power loading, exact SER
- ---- Optimal loading, SER bound
- ──── Optimal loading, exact SER SER vs SNR: Channel 1, 16-QAM

- -+- - 1D Beam forming, SER bound
- —+— 1D Beam forming, exact SER
- -o- - Equal power loading, SER bound
- —o— Equal power loading, exact SER
- - - - Optimal loading, SER bound
- ——— Optimal loading, exact SER SER vs SNR: Channel2, QPSK —•— 1D Beam forming, exact SER
—□— 2D Beam forming, exact SER
—○— Equal power loading, exact SER
——— Optimal loading, exact SER SER vs SNR: Channel 2, 16-QAM

- 1D Beam forming, exact SER
- 2D Beam forming, exact SER
- Equal power loading, exact SER
- Optimal loading, exact SER

SPACE-TIME CODING USING ESTIMATED CHANNEL INFORMATION

This application claims priority from U.S. Provisional Application Ser. No. 60/374,886, filed Apr. 22, 2002, U.S. Provisional Application Ser. No. 60/374,935, filed Apr. 22, 2002, U.S. Provisional Application Ser. No. 60/374,934, filed Apr. 22, 2002, U.S. Provisional Application Ser. No. 60/374,981, filed Apr. 22, 2002, U.S. Provisional Application Ser. No. 60/374,933, filed Apr. 22, 2002, the entire contents of which are incorporated herein by reference.

STATEMENT REGARDING FEDERALLY SPONSORED RESEARCH OR DEVELOPMENT

This invention was made with Government support under Contract Nos. ECS-9979443 and CCR-0105612, awarded by the National Science Foundation, and Contract No. DAAD19 01-2-0011 (University of Delaware Subcontract No. 497420) awarded by the U.S. Army. The Government may have certain rights in this invention.

TECHNICAL FIELD

The invention relates to wireless communication and, more particularly, to coding techniques for multi-antenna transmitters.

BACKGROUND

Space-time coding using multiple transmit-antennas has been recognized as an attractive way of achieving high data rate transmissions with diversity and coding gains in wireless applications. For example, multi-antenna transmitters can offer significant diversity and coding advantages over single antenna transmitters. A number of space-time coding transmitter designs have been developed.

Most conventional space-time coding transmitters are designed for the scenario where the propagation channels are deterministically known. In practical wireless systems, however, propagation channels are typically not known at the transmitter. Moreover, in practical wireless systems, propagation channels can change over time, with changes in settings of the wireless devices or movement of one wireless device relative to the other wireless device, e.g., movement of a mobile unit relative to a base station.

SUMMARY

In general, the invention is directed to space-time coding techniques for wireless communication systems in which the transmitter makes use of multiple transmit antennas. As described in greater detail below, the transmitter uses channel information estimated by a receiving device and returned to the transmitter, e.g., as feedback. In other words, the channel information is estimated at the receiver and returned to the transmitter for use in subsequent transmissions to that the signals can be coded in an improved manner.

In one exemplary embodiment, the transmitter makes use of a mean feedback information that defines a mean channel value associated with the different channels of the different antennas or different multi-paths from one or more antennas. In another exemplary embodiment, the transmitter makes use of covariance feedback, e.g., statistical values associated with the different channels. The mean feedback may be particularly useful when the channels are slow time-varying channels, and the covariance feedback may be particularly useful when the channels are rapid time-varying channels. In other words, if the channels change slowly, the mean feedback can be very useful, but if the channels change rapidly the covariance feedback may be more useful.

In one embodiment, the invention provides a method comprising receiving estimated channel information for a space-time wireless communication system, and coding signals for transmission by a multiple antenna transmitter based on the estimated channel information.

In another embodiment, the invention provides a wireless device comprising a coding unit to select symbols based on received channel information estimated for a space-time wireless communication system, and multiple transmit antennas to send the symbols.

In some embodiments, the invention can be implemented in software. In that case, the invention may be directed to a computer readable medium comprising computer readable instructions that when executed in a wireless device cause the device to code signals for transmission by a multiple antenna transmitter in a space-time wireless communication system based on received channel information estimated by a receiving device.

In another embodiment, the invention provides a wireless device comprising means for receiving estimated channel information for a space-time wireless communication system, and means for coding signals for transmission by a multiple antenna transmitter based on the estimated channel information.

In another embodiment, the invention provides a space-time wireless communication system comprising a first wireless device that estimates channel information based on a received signal and transmits the channel information, and a second wireless device that receives the estimated channel information from the first wireless device and codes signals for subsequent transmission via multiple transmit antennas based on the estimated channel information.

In another embodiment, the invention provides a method comprising receiving communications from a transmitting device via multiple communication channels associated with multiple transmit antennas of the transmitting device, computing estimated channel information for the multiple channels, and communicating the estimated channel information to the transmitting device to control coding of signals for transmission by the multiple antennas.

In another embodiment, the invention provides a wireless device comprising means for estimating channel information for a space-time wireless communication system, and means for communicating the estimated channel information to a transmitter for use in transmitting subsequent signals by multiple antennas.

In another embodiment, the invention provides a method comprising receiving estimated channel information associated with multiple channels of a wireless communication signal, and coding subsequent signals for transmission based on the estimated channel information.

The invention may be capable of providing certain advantages. Specifically, the invention can improve the performance of wireless communication. Numerous embodiments and mathematical techniques are outlined in greater detail below, which can achieve varying levels of performance. In some cases, trade-offs between performance and complexity can be made to meet a specific level of performance and a specific level of complexity.

The details of one or more embodiments of the invention are set forth in the accompanying drawings and the descrip-

DETAILED DESCRIPTION

The invention is directed to transmitter designs for space-time coding in which the transmitter makes use of multiple transmit antennas. The transmitter uses channel information estimated by a receiving device and returned to the transmitter, e.g., as feedback. In some embodiments outlined in greater detail below, the transmitter makes use of mean feedback information that defines a mean channel value associated with the channels of the different antennas or different multi-paths from one or more antennas. In other embodiments outlined in greater detail below, the transmitter makes use of covariance feedback, e.g., statistical values associated with the different channels. The mean feedback may be particularly useful when the channels are slow time-varying channels, and the covariance feedback may be particularly useful when the channels are rapid time-varying channels. In other words, if the channels change slowly the mean feedback can be very useful, but if the channels change rapidly the covariance feedback may be more useful.

Figure 1:
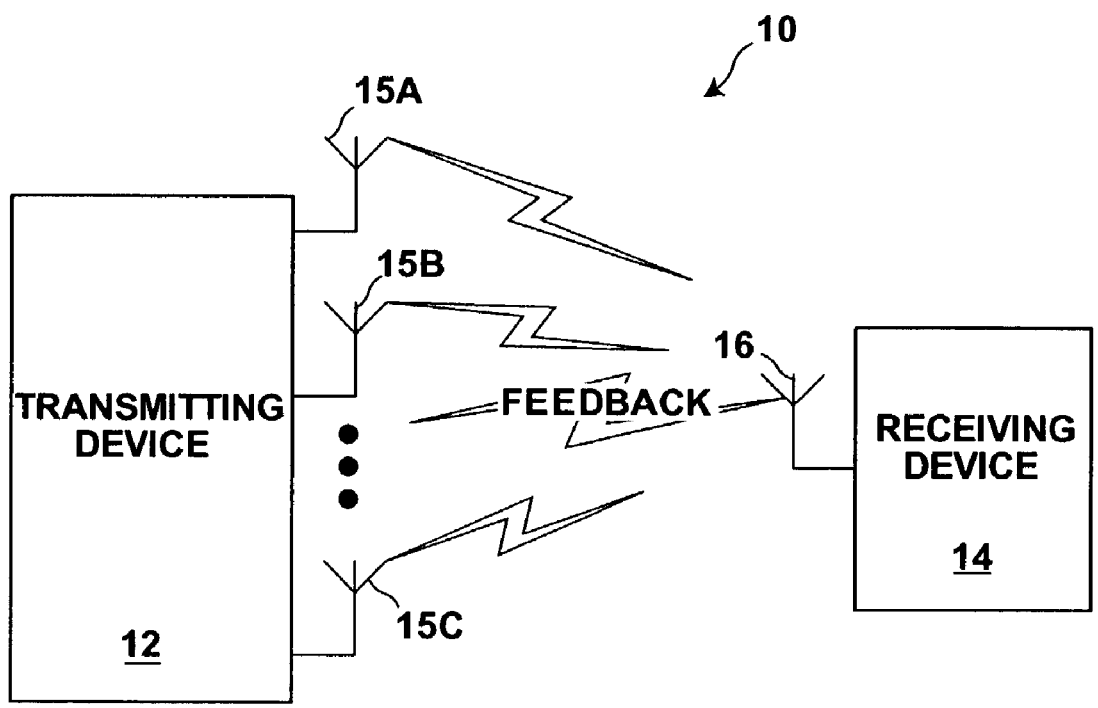
FIG. 1 is a block diagram of a space-time wireless communication system according to an embodiment of the invention.

FIG. 1 is a simplified block diagram of a space-time wireless communication system 10 including a transmitting device 12 (also referred to as transmitter 12) and a receiving device 14 (also referred to as receiver 14). In accordance with space time coding, transmitting device 12 codes signals and transmits the signals via multiple antennas 15A, 15B, 15C. Receiving device 14 includes antenna 16 for receiving signals from device 12. In some cases, receiving device 14 may also include multiple antennas, but the invention is not limited in that respect.

Transmitting device 12 and receiving device 14 may comprise any of a wide variety of wireless devices that communicate with one another. For example, one of devices 12, 14 may comprise a mobile device and the other of devices 12, 14 may comprise a base station, e.g., in a digital cellular communication system. Alternatively, one of devices 12, 14 may comprise a wireless computer and the other may comprise a wireless network access point, e.g., in a wireless networking setting. In addition, in other applications, each of devices 12, 14 may comprise direct two-way communication devices. In general, system 10 may comprise any of a wide variety of wireless communication systems which could benefit from the feedback techniques described herein.

In accordance with the invention, receiving device 14 measures channel information, such as the fading amplitudes of the various channels associated with transmission antennas 15A, 15B, 15C. Receiving device 14 sends this measured channel information back to transmitting device 12 so that subsequent signals can be coded based on the measured channel information. In other words, the invention provides a feedback technique in which channel information for multiple space-time channels collected at receiving device 14 is returned to transmitting device 12 for use in subsequent transmissions. In some examples, the channel information includes a mean channel value of the channels associated with the different transmit antennas 15A, 15B, 15C. In other examples covariance feedback is used in which the channel information includes statistical values associated with the different channels.

The signals transmitted between devices 12, 14 may comprise single carrier signals, or multi-carrier signals. Any of a wide variety of modulation techniques can be used, including, for example, code division multiple access (CDMA), time division multiple access (TDMA), frequency division multiple access (FDMA), orthogonal frequency division multiplexing (OFDM), various other modulation techniques, or even two or more modulation techniques.

In a space-time wireless system (such as system 10) with $N_t$ transmit antennas and $N_r$ receive antennas, the antenna coefficients can be collected into channel matrix H, with the $(\mu, \nu)$th entry as $h_{\mu\nu}$. For each receive antenna $\nu$, the vector: $h_\nu := [h_{1\nu}, \ldots, h_{N_t\nu}]^T$ can be defined. The columns of H can be concatenated into one channel vector as:

$$h = vec(H) = \begin{bmatrix} h_1 \\ \vdots \\ h_{N_r} \end{bmatrix} \quad (1.1)$$

With perfect channel state information, transmitter 12 knows each realization of h. However, with partial channel state information (CSI), transmitter 12 has some uncertainties on the channel realization h. The uncertainties can be modeled as unknown perturbations around the nominal channel. Specifically, conditioned on channel feedback, transmitter 12 perceives a "nominal-plus-perturbation" channel model as:

$$\check{h} = \bar{h} + \epsilon, \quad (1.2)$$

where $\bar{h}$ is deterministic known per feedback realization, and $\epsilon$ is a random vector capturing all uncertainties about h. The partial channel knowledge about the channel will then include the nominal channel $\bar{h}$, and the statistical description on the perturbation error $\epsilon$. We here use $\check{h}$ to differentiate the channel perceived at the transmitter from the true channel h; however they have quite different statistical properties. The perception at the transmitter will be updated every time new feedback information becomes available.

The matrix corresponding to EQUATION 1.2 is:

$$\check{H} = \bar{H} + \Xi, \quad (1.3)$$

where $\bar{H}$ and $\Xi$ contain the nominal values and unknown perturbations to describe the $N_t \times N_r$ channel matrix H.

In practice, the perturbation errors may not be Gaussian distributed. But a Gaussian assumption will greatly simplify the transmitter design. The resulting closed-form solutions provide much insight on transmitter optimization based on partial channel knowledge. Hence, for convenience and simplicity, we model $\tilde{h}$ as a Gaussian random vector. The statistical property is then described by the mean and covariance matrix of $\tilde{h}$. Specifically, based on channel feedback, the transmitter perceives a random channel distribution as:

$$\tilde{h} \sim CN(\bar{h}, \Sigma_h). \tag{1.4}$$

EQUATION 1.4 provides the general model with Gaussian assumption on the uncertain perturbation errors. We next specify two simplified models, termed as mean feedback and covariance feedback, respectively.

In mean feedback, all entries of $\epsilon$ are assumed to be independent from each other, but having the same covariance $\sigma_\epsilon^2$. Specifically, $$\tilde{h} \sim CN(\bar{h}, \sigma_\epsilon^2 I_{N_t N_r}). \tag{1.5}$$

Channel mean feedback is suitable to slowly time-varying channels, where instantaneous channel values are fed back. The same uncertainty on all channel coefficients is assumed for simplicity.

We next highlight several possibilities where channel mean feedback can be realized in practice. We illustrate how to obtain $(\bar{h}, \sigma_\epsilon^2)$ based on feedback information.

Case 1 (Ricean fading channels): In this case, there exist a line-of-sight (LOS) path and diffusing non-LOS paths between transmitter 12 and receiver 14. Hence, the true channel itself is Ricean distributed. We further assume that the diffusing components of all channel coefficients are uncorrelated but with identical variance $\sigma_h^2$. Hence, $$h \sim CN(\mu_h, \sigma_h^2 I_{N_t N_r}), \tag{1.6}$$

where $\mu_h$ contains the channel coefficients corresponding to the LOS paths. In this scenario, we assume that receiver 12 feeds back to transmitter 14 the instantaneous values for the LOS paths and the variance of the diffusing components, without errors. We thus have $$\bar{h}=\mu_h, \sigma_\epsilon^2=\sigma_h^2, \tag{1.7A and 1.7B}$$

in the channel mean feedback model.

Case 2 (delayed feedback): Here we assume that: i) the channel coefficients are slowly time varying according to Jakes' model with Doppler frequency $f_d$; ii) antennas 15 are well separated. The channel coefficients are i.i.d. Gaussian distributed as $h \sim CN(0, \sigma_h^2 I_{N_t})$; and, iii) the channel is acquired perfectly at receiver 14 and is fed back to transmitter 12 via a noiseless channel with delay $\tau$. Let $\tilde{h}_f$ denote the channel feedback. Notice that both $h$ and $\tilde{h}_f$ are complex Gaussian vectors, drawn from the same distribution $CN(0, \sigma_h^2 I_{N_t})$.

It can be shown that $E\{h\tilde{h}_f^H\}=\rho \sigma_h^2 I_{N_t}$, where the correlation coefficient $\rho:=J_0(2\pi f_d \tau)$ determines the feedback quality. The minimum mean-square error (MMSE) estimator of $h$ based on $\tilde{h}_f$ is given by $E\{h|\tilde{h}_f\}=\rho \tilde{h}_f$, with estimation error having covariance matrix $\sigma_h^2(1-|\rho|^2)I_{N_t N_r}$. Thus, for each realization of $\tilde{h}_f = \tilde{h}_{f,0}$, the transmitter obtains:

$$\bar{h}=\rho \tilde{h}_{f,0}, \sigma_\epsilon^2=\sigma_h^2(1-|\rho|^2). \tag{1.8A and 1.8B}$$

The deterministic values of $\bar{h}$ are updated when the next feedback becomes available.

Case 3 (quantized feedback): In this case, we assume that the channel is acquired at receiver 14, and is quantized to $2^b$ code words $\{a(j)\}_{j=1}^{2^b}$. The quantizer output is then encoded by $b$ information bits, which are fed back to transmitter 12 with a negligible delay over a noiseless low-speed feedback channel. We assume that transmitter 12 has the same code book, and reconstructs the channel as $a(j)$, if the index $j$ is suggested by the received $b$ bits. Although the quantization error is non-Gaussian and non-white in general, we assume that the quantization errors can be approximated by zero-mean and white Gaussian noise samples, in order to simplify the transmitter design. With $\epsilon_Q^2$ denoting the approximate variance of the quantization error, the parameters in (1.5) are:

$$\bar{h}=a(j), \text{ if index } j \text{ is received}, \sigma_\epsilon^2=\epsilon_Q^2. \tag{1.9A and 1.9B}$$

In addition to Cases 1-3, channel prediction based on pilots inserted at transmitter 12 is also another realization of the general notion of "mean feedback". Notice that channel predictors take both the feedback delay and the estimation errors into account.

In covariance feedback, we assume that the channel $h$ varies too rapidly for transmitter 12 to track its instantaneous value. In this case, the channel mean is set to zero, and the relative geometry of the propagation paths manifests itself in a non-white covariance matrix $\Sigma_h$. Specifically, we simplify (1.4) to $$\tilde{h} \sim CN(0_{N_t N_r \times 1}, \Sigma_h). \tag{1.10}$$

The statistical information $\Sigma_h$ needs to be updated infrequently.

Through field measurements, ray-tracing simulations, or using physical channel models, transmitter 12 can acquire such statistical CSI a priori. For certain applications such as fixed wireless, the spatial fading correlations can be determined from such physical parameters as antenna spacing, antenna arrangement, angle of arrival, and angle spread. Likewise, for systems employing polarization diversity, second-order channel statistics will involve the correlation between differently polarized transmissions. Alternatively, receiver 14 can estimate the channel correlations by long-term averaging of the channel realizations, and feed them back reliably to transmitter 12 through a low data rate feedback channel. In applications involving Time Division Duplex (TDD) protocols, transmitter 14 can also obtain channel statistics directly since the forward and backward channels share the same physical (and statistically invariant) channel characteristics even when the time separation between the forward and the backward link is long enough to render the deterministic instantaneous channel estimates outdated. In Frequency Division Duplex (FDD) systems with small angle spread, the downlink channel covariance estimates can be also obtained accurately from the uplink channel covariance through proper frequency calibration processing.

EQUATION 1.10 specifies a general correlation model for Rayleigh fading channels. However other simplifications can be implemented based on particular propagation environments. EQUATION 1.10 can be further simplified by considering an application scenario where the base station (BS) is unobstructed, and the subscriber unit (SU) is surrounded by rich local scatterers. In this case, the receive antennas are uncorrelated, and the transmit correlation for each receive antenna $v$ are identical with $$\Sigma_0 = E\{h_v h_v^H\}, \forall v, \tag{1.11}$$

Again, in FIG. 1, either of transmitting device 12 or receiving device 14 can comprise the base station or the mobile unit.

$\Sigma_0$ is an arbitrary Hermitian matrix. It turns out, that the antenna spacing at the SU is much smaller (one or two orders of magnitude) than that at the BS, to yield uncorrelated chan nels among different antennas. In this simplified scenario, we have $$\Sigma_h = I_{N_r} \otimes \Sigma_0. \tag{1.12}$$

Albeit restrictive for the case with multiple receive antennas, the considered model in (1.12) is the most general for the single receive-antenna case, with $\Sigma_h = \Sigma_0$.

Figure 2:
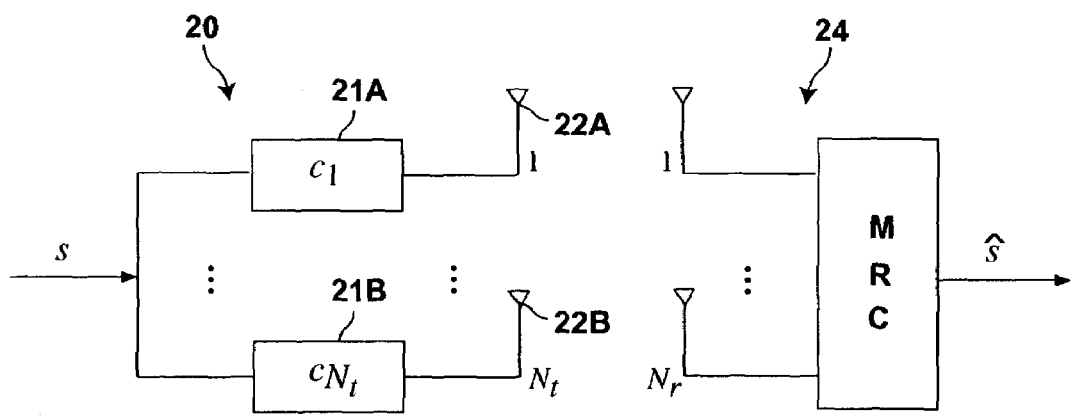
FIG. 2 is another block diagram of a space-time wireless communication system according to an embodiment of the invention.

FIG. 2 illustrates a relatively simple design of transmitter 20, which may correspond to transmitter device 12 (FIG. 1). Also depicted in FIG. 2 is a receiver 24. Transmitter 20 includes a set of preorders 21A-21B and a set of antennas 22A-22B.

Transmitter 20 spreads the information symbol over both space and time. On each antenna (22) $\mu$, a length P spreading code $c_\mu := [c_\mu(0), \ldots, c_\mu(P-1)]^T$ is used. Different antennas 22 use different spreading codes. This is inherently a low rate system, since only one information symbol is transmitted in P time slots. We will first look at this simple system.

Define the $P \times N_t$ space time matrix $C := [c_1, \ldots, c_{N_t}]$, and collect the received samples corresponding to each information symbol into a $P \times N_r$ matrix Y. The channel input-output relationship is $$Y = sCH + W_1 \tag{1.13}$$

where W contains additive white Gaussian noise (AWGN) with each entry having variance $N_0$.

The receiver weights the contribution from each entry of Y to form a decision variable as:

$$\hat{s} = \mathrm{tr}\{G^H Y\} \tag{1.14}$$

Based on (1.13), a desirable maximum ratio combiner (MRC) can be found as:

$$G_{opt} = CH \tag{1.15}$$

The signal to noise ratio (SNR) at the MRC output is $$\gamma = \frac{E\{|\mathrm{tr}(H^H C^H CH)s|^2\}}{E\{|\mathrm{tr}(H^H C^H W)|^2\}} = \mathrm{tr}(H^H C^H CH)\frac{E_s}{N_0}, \tag{1.16}$$

where $E_s := E\{|s|^2\}$ is the average energy of the underlying signal constellation.

For each realization of $\gamma$, the instantaneous symbol error rate (SER) is $$P_{s,PSK}(\gamma) = \frac{1}{\pi} \int_0^{\frac{(M-1)\pi}{M}} \exp\left(-\gamma \frac{g_{PSK}}{\sin^2 \theta}\right) d\theta, \tag{1.17}$$

$$P_{s,QAM}(\gamma) = \frac{b_{QAM}}{\sqrt{M}} \int_0^{\frac{\pi}{4}} \exp\left(-\gamma \frac{g_{QAM}}{\sin^2 \theta}\right) d\theta + \tag{1.18}$$

$$b_{QAM} \int_{\frac{\pi}{4}}^{\frac{\pi}{2}} \exp\left(-\gamma \frac{g_{QAM}}{\sin^2 \theta}\right) d\theta,$$

where $b_{QAM} := 4(1 - 1/\sqrt{M})/\pi$, and the constellation-specific constant g is defined as:

$$g_{PSK} = \sin^2\left(\frac{\pi}{M}\right) \text{ for } M\text{-ary } PSK, \tag{1.19}$$

$$g_{QAM} = \frac{3}{2(M-1)} \text{ for } M\text{-ary } QAM. \tag{1.20}$$

Hence, if the channel is perfect known at transmitter 20, the SER performance can be easily determined from (1.17) and (1.18).

However, transmitter 20 has only partial knowledge $\bar{h}$. Transmitter 20 views that the real channel h will be just one realization of $\bar{h}$ during this feedback interval. Since $\bar{h}$, and thus h, is random, we thus need to average the SER in (1.17) and (1.18) over all possible $\gamma$.

For notation simplicity, define the matrix $$Z := (I \otimes C^H C)\frac{E_s}{N_0}. \tag{1.21}$$

Using the identity $$\mathrm{tr}(ABC) = \mathrm{vec}^H(A^H)(I \otimes B)\mathrm{vec}(C), \tag{1.22}$$

we simplify the SNR in (1.16) to $$\gamma = h^H Z h. \tag{1.23}$$

We need to use the following identity:

$$E_z\{\exp(-z^H A z)\} = \frac{\exp\left(-\mu^H A \left(I + \sum A\right)^{-1} \mu\right)}{|I + \sum A|}, \tag{1.24}$$

where A is an arbitrary matrix, and $z \sim CN(\mu, \Sigma)$. Averaging over $\gamma$ based on partial CSI, we obtain $$P_{s,PSK} = \frac{1}{\pi} \int_0^{\frac{(M-1)\pi}{M}} \frac{\exp\left(-\bar{h}^H g^Z [I\sin^2\theta + g \sum_h Z]^{-1} \bar{h}\right)}{|I\sin^2\theta + g \sum_h Z|} d\theta \tag{1.25}$$

$$P_{s,QAM} = \frac{b_{QAM}}{\sqrt{M}} \int_0^{\frac{\pi}{4}} \frac{\exp\left(-\bar{h}^H g^Z [I\sin^2\theta + g \sum_h Z]^{-1} \bar{h}\right)}{|I\sin^2\theta + g \sum_h Z|} d\theta + \tag{1.26}$$

$$b_{QAM} \int_{\frac{\pi}{4}}^{\frac{\pi}{2}} \frac{\exp\left(-\bar{h}^H g^Z [I\sin^2\theta + g \sum_h Z]^{-1} \bar{h}\right)}{|I\sin^2\theta + g \sum_h Z|} d\theta,$$

where g takes values in (1.19) and (1.20).

Once the matrix C is given, transmitter 20 can evaluate the average performance based on on partial CSI in (1.4). We will use this to evaluate the exact SER performance in our numerical results. However, these exact SER expressions are not convenient for transmitter design. We thus rely on an upper bound on the SER.

By observing that the integrand in (1.25) and (1.26) peaks at $\theta = \pi/2$, we obtain a unifying SER upper bound as:

$$P_{s,bound} = \alpha \exp(-\bar{h}^H g Z |I + g \Sigma_h Z|^{-1} \bar{h}) |I + g \Sigma_h Z|^{-1}, \tag{1.27}$$

where $$\alpha := \frac{M-1}{M}.$$

Without any constraint, maximizing $P_{s,bound}$ leads to the trivial solution that requires infinite power to be transmitted. A practical constraint that takes into account limited budget resources is the average transmitted power, which is expressed as $P_0 = E\{tr\{(sC)^H(sC)\}\} = E_s tr\{C^H C\}$. Without loss of generality, we assume that $P_0 = E_s$, and $tr\{C^H C\} = 1$; i.e., the total transmitted power is $E_s$ per symbol. An optimization problem can be formulated as:

$$C_{opt} = \text{argmin } P_{s,\,bound}.$$
$$C; \, tr\{C^H C\} = 1 \quad (1.28)$$

For any matrix, we perform the singular value decomposition (SVD) to obtain $$C = \Phi \Delta^{\frac{1}{2}} U_c^H, \quad (1.29)$$

where $\Delta := \text{diag}(\delta_1, \ldots, \delta_{N_t})$. Notice that as long as $P \geq N_t$ and $\Phi^H \Phi = I_{N_t}$, we have $$C^H C = U_c \Delta U_c^H, \quad (1.30)$$

thus, the choice of $\Phi$ does not affect the performance. We first assume that this is indeed the case, and look for optimal $U_c$ and $D_c$.

With $\Sigma_h = \sigma_\epsilon^2 I_{N_t N_r}$ in mean feedback, we deduce from (1.21) and (1.30):

$$gZ(I + g\sum_h Z)^{-1} = I_{N_r} \otimes \left[\frac{\beta}{\sigma_\epsilon^2} U_c \Delta U_c (I + \beta U_c \Delta U_c^H)^{-1}\right], \quad (1.31)$$

where the constant $\beta$ is defined as:

$$\beta = g\sigma_\epsilon^2 \frac{E_\delta}{N_0}, \quad (1.32)$$

We thus simplify the bound in (1.27) to:

$$P_{s,bound} = \frac{\alpha}{|I_{N_t} + \beta D_c|^{N_r}} \exp\left(\frac{1}{\sigma_\epsilon^2} tr\{U_c^H \overline{H}\overline{H}^H U_c \beta D_c (I_{N_t} + \beta D_c)^{-1}\}\right). \quad (1.33)$$

The simplified SER bound in (1.33) allows us to find optimal $U_c$ and $\Delta$ in closed form, as detailed in the following.

We first decompose $\overline{H}\overline{H}^H$ as:

$$\overline{H}\overline{H}^H = U_H A U_H^H, \, A := \text{diag}(\lambda_1, \lambda_2, \ldots, \lambda_{N_r}), \quad (1.34)$$

where, without loss of generality, the eigenvalues are arranged in a non-increasing order: $\lambda_1 \geq \lambda_2 \geq \ldots \geq \lambda_{N_r}$.

Substituting (1.33) into (1.28), we can establish that a desirable $U_c$ is:

$$U_{c,opt} = U_H. \quad (1.35)$$

With the $U_c$ in (1.35), we simplify (1.33) to:

$$P_{s,bound} = \alpha \left[\prod_{\mu=1}^{N_t} \frac{1}{1+\delta_\mu \beta} \exp\left(\frac{-\kappa_\mu \delta_\mu \beta}{1+\delta_\mu \beta}\right)\right]^{N_r}. \quad (1.36)$$

$$\text{where } \kappa_\mu = \frac{\lambda_\mu}{N_r \sigma_\epsilon^2}. \quad (1.37)$$

$\Delta$ can be found in closed-form when $N_r = 1$, where we have only one non-zero eigen-value $\lambda_1$. Since $\ln(.)$ is a monotonically increasing function, we define $$\epsilon_1 := \ln P_{s,bound} = \ln \alpha - \sum_{\mu=1}^{N_t} \ln(1+\delta_\mu \beta) - \frac{\lambda_1 \delta_1 \beta}{\sigma_\epsilon^2 (1+\delta_1 \beta)}. \quad (1.38)$$

Our equivalent constrained optimization problem is:

$$\Delta_{opt} = \text{argmin } \epsilon_1$$
$$\Delta \geq 0; \, tr(\Delta) = 1 \quad (1.39)$$

We adopt the special notation $|x|_+ := \max(x, 0)$. We define several constants as:

$$a := \left(1 + \frac{N_t}{\beta}\right)^2, \, c := N_t(N_t - 1), \quad (1.40)$$

$$b := \left[\frac{\lambda}{\beta \sigma_\epsilon^2} + \left(1 + \frac{N_t}{\beta}\right)(2N_t - 1)\right].$$

The final solution can then be expressed as:

$$\delta_2 = \ldots = \delta_{N_t} = \left[\frac{2a}{b + \sqrt{b^2 - 4ac}} - \frac{1}{\beta}\right]_+ \quad (1.41)$$

$$\delta_1 = 1 - (N_t - 1)\delta_2.$$

We now derive an approximate solution for $\Delta$, that is applicable to any $N_r$. First, we recognize that $$E\{\exp(-\gamma)\} = \frac{1}{1+\delta_\mu \beta} \exp\left(-\frac{\kappa_\mu \delta_\mu \beta}{1+\delta_\mu \beta}\right), \quad (1.42)$$

where $\sqrt{\gamma}$ is Rician distributed with Rician factor $K_\mu$ and power $(1+K_\mu)\delta_\mu \beta$. It is well known that one can approximate well a Ricean distribution with Ricean factor $K_\mu$ by a Nakagami-m distribution with $m_\mu$ to be:

$$m_\mu = \frac{(1+\kappa_\mu)^2}{1+2\kappa_\mu}. \quad (1.43)$$

Note that a Ricean distribution with $K_\mu = 0$ coincides with a Nakagami distribution having $m_\mu = 1$, and both reduce to a Rayleigh distribution. For a Nakagami random variable $\sqrt{\gamma'}$ with power $(1+K_\mu)\delta_\mu \beta$, we have $$E\{\exp(-\gamma')\} = \left(1 + \frac{(1+\kappa_\mu)\delta_\mu\beta}{m_\mu}\right)^{-m_\mu}. \quad (1.44)$$

Approximating $\sqrt{\gamma}$ with Ricean distribution by $\sqrt{\gamma'}$ with Nakagami distribution, we obtain:

$$P_{s,bound} \approx \tilde{P}_{s,bound} = \alpha\left[\prod_{\mu=1}^{N_t}\left(1 + \frac{(1+K_\mu)\delta_\mu\beta}{m_\mu}\right)^{-m_\mu}\right]^{N_r}. \quad (1.45)$$

We define the objective function:

$$\varepsilon_2 := \ln\tilde{P}_{s,bound} = \ln\alpha - N_r\left[\prod_{\mu=1}^{N_t} m_\mu \ln\left(1 + \frac{\delta_\mu(1+K_\mu)\beta}{m_\mu}\right)\right]. \quad (1.46)$$

Our optimization problem is approximated by:

$$\Delta_{opt} = \arg\min \varepsilon_2$$
$$\Delta \geq 0; \operatorname{tr}(\Delta) = 1 \quad (1.47)$$

Solving (1.46) using the Lagrange method, we have $$\delta_\mu = \left[\frac{m_\mu}{\zeta} - \frac{m_\mu}{(1+\kappa_\mu)\beta}\right]_+. \quad (1.48)$$

where $\zeta$ is the Lagrangian multiplier, which can be solved by the power constraint $\operatorname{tr}(\Delta)=1$.

Suppose that the final solution ends up with $\bar{N}_t$ non-zero eigenvalues in $\Delta$. Thus, we have $\delta_\mu = 0$, for $\mu \geq \bar{N}_t + 1$. For each $\mu = 1, \ldots, \bar{N}_t$, we solve $\zeta$ using the power constraint to obtain:

$$\delta_\mu = \frac{m_\mu}{\sum_{l=1}^{\bar{N}_t} m_l}\left(1 + \sum_{l=1}^{\bar{N}_t}\frac{m_l}{(1+K_l)\beta}\right) - \frac{m_\mu}{(1+K_\mu)\beta}. \quad (1.49)$$

To ensure that $\delta_{\bar{N}_t} > 0$, the transmitted power should adhere to the following constraint:

$$\frac{E_s}{N_0} > \frac{1}{g\sigma_e^2}\sum_{l=1}^{\bar{N}_t-1}\underbrace{\frac{(\lambda_l - \lambda_{\bar{N}_t})(N_r\sigma_e^2 + \lambda_l)}{(N_r\sigma_e^2 + \lambda_{\bar{N}_t})(N_r\sigma_e^2 + 2\lambda_l)}}_{:=\gamma_{th,\bar{N}_t}}. \quad (1.50)$$

From (1.49) and (1.50), we describe the practical algorithm to calculate $\Delta$, in the following steps:

Step 1: For $r=1, \ldots, N_t$, calculate $\gamma_{th,r}$ from (1.50), based only on the first $r$ eigenvalues of $\Lambda$.

Step 2: With the given power budget $E_s$ ensuring that $E_s/N_0$ falls in the interval $[\gamma_{th,r}, \gamma_{th,r+1}]$, set $\delta_{r+1}, \ldots, \delta_{N_t}=0$, and obtain $\delta_1, \ldots, \delta_r$ according to (1.49) with $\bar{N}_t = r$.

Hence, for any $N_r$, we obtain a closed-form, albeit approximate, solution. With $N_r = 1$, all the thresholds in (1.50) reduce to:

$$\gamma_{th} = \frac{\lambda_1}{g\sigma_e^4}\left(\frac{\sigma_e^2 + \lambda_1}{\sigma_e^2 + 2\lambda_1}\right). \quad (1.51)$$

Hence, the approximate solution reduces to $$\delta_2 = \cdots = \delta_{N_t} = \begin{cases} \delta_2^o & E_s/N_0 > \gamma_{th} \\ 0 & E_s/N_0 \leq \gamma_{th} \end{cases}, \quad (1.52)$$
$$\delta_1 = 1 - \delta_2(N_t - 1),$$

where $\delta_2^o$ is simplified from (1.49) as:

$$\delta_2^o = \frac{\sigma_e^2(\sigma_e^2 + 2\lambda_1)}{N_t\sigma_e^2(\sigma_e^2 + 2\lambda_1) + \lambda_1^2}\left[1 + \frac{1}{\beta}\left(N_t - \frac{\lambda_1}{\sigma_e^2 + 2\lambda_1}\right)\right] - \frac{1}{\beta}. \quad (1.53)$$

For the case of $N_r = 1$, we will compare the approximate solution in (1.52) with the exact solution in (1.41) later on.

In the covariance feedback, we only consider the special case of (1.12). Substituting (1.12) into (1.27), we obtain $$P_{s,bound} = \alpha\left|I + \sum_0 C^H Cg\frac{E_s}{N_0}\right|^{-N_e}. \quad (1.54)$$

We diagonalize $\Sigma_0$ using its spectral decomposition:

$$\Sigma_0 = U_h D_h U_h^H, D_h := \operatorname{diag}(\lambda_1, \ldots, \lambda_{N_t}), \quad (1.55)$$

where $U_h$ is unitary, and $\lambda_\mu$ denotes the $\mu$th eigenvalue of $\Sigma_0$ that is non-negative: $\lambda_\mu \geq 0$. Without loss of generality, we assume that $\lambda_\mu$'s are arranged in a non-increasing order: $\lambda_1 \geq \ldots \geq \lambda_{N_t} \geq 0$. Substituting (1.30) and (1.55) into (1.54), we obtain:

$$P_{s,bound} = \alpha\left|I + D_h^{\frac{1}{2}}U_h^H U_c \Delta U_c^H U_h D_h^{\frac{1}{2}} g\frac{E_s}{N_0}\right|^{-N_e} \quad (1.56)$$

For any given $\Delta$, the SER bound in (1.56) will be minimized by the choice of $$U_{c,opt} = U_h, \quad (1.57)$$

based on the Hadamard's inequality.

With the optimal $U_c$, we define our objective function as:

$$\varepsilon_g := \ln P_{s,bound} = -N_r \ln\left|I_{N_2} + D_h\Delta\frac{gE_s}{N_0}\right| \quad (1.58)$$
$$= -N_r\prod_{\mu=1}^{N_t}\ln\left(1 + \lambda_\mu\delta_\mu\frac{gE_s}{N_0}\right).$$

In this case, $\Delta$ is the solution of $$\Delta_{opt} = \arg \min \epsilon_3.$$

$$\Delta \geq 0; \operatorname{tr}(\Delta) = 1 \quad (1.59)$$

Solving (1.46) using the Lagrange method, we have $$\delta_\mu = \left[ -\frac{1}{\zeta} - \frac{N_0}{\lambda_\mu g E_8} \right]_+ \quad (1.60)$$

where $\zeta$ is the Lagrangian multiplier, which can be solved by the power constraint $\operatorname{tr}(\Delta) = 1$.

Suppose that the given power budget, $E_8$ supports $\overline{N}_t$ non-zero $\delta_\mu$'s. Solving $\zeta$ using the power constraint, which leads to $$\delta_\mu = \left[ \frac{1}{\overline{N}_t} + \frac{N_0}{g E_8} \left( \frac{1}{\overline{N}_t} \sum_{l=1}^{\overline{N}_t} \frac{1}{\lambda_l} - \frac{1}{\lambda_\mu} \right) \right]_+. \quad (1.61)$$

To ensure $\delta_{\overline{N}_t} > 0$, the transmit power should ensure the following constraint:

$$\frac{E_s}{N_0} > \underbrace{\frac{1}{g} \left( \frac{\overline{N}_t}{\lambda_{\overline{N}_t}} - \sum_{\mu=1}^{\overline{N}_t} \frac{1}{\lambda_\mu} \right)}_{:=\gamma_{th,\overline{N}_t}}. \quad (1.62)$$

Based on (1.62) and (1.61), the practical algorithm for $\Delta$ can be summarized in the following steps:

Step 1: For $r = 1, \ldots, N_t$, calculate $\gamma_{th,r}$ from (1.62), based only on the first $r$ channel eigenvalues of $D_h$.

Step 2: With the given power budget $E_8$ leading to $E_8/N_0$ in the interval $[\gamma_{th,r}, \gamma_{th,r+1}]$, set $\delta_{r+1}, \ldots, \delta_{N_t} = 0$, and obtain $\delta_1, \ldots, \delta_r$ according to (1.61) with $\overline{N}_t = r$.

Figure 3:
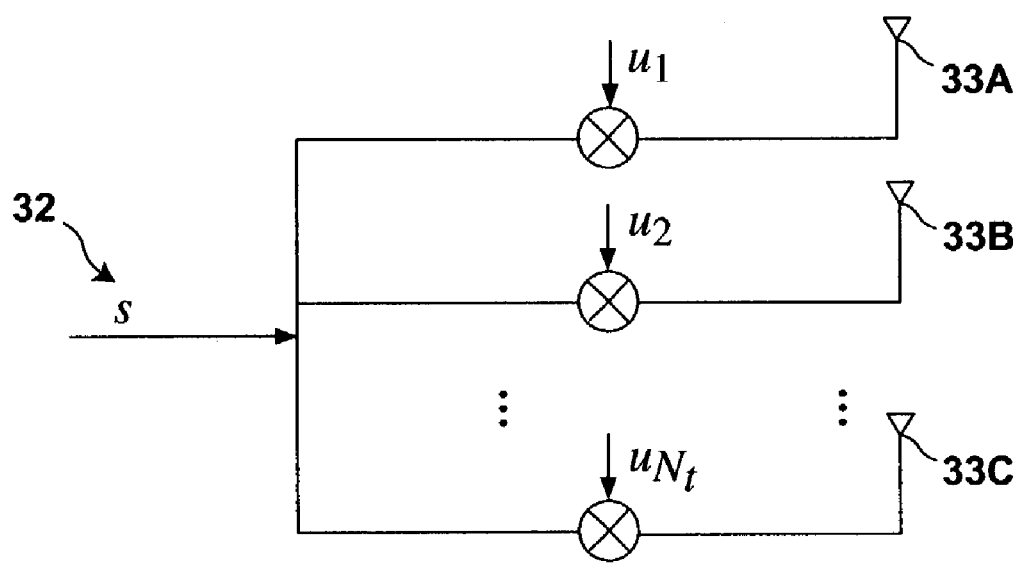
FIG. 3 is a block diagram illustrating multiple antennas of a transmitter in accordance with an embodiment of the invention.

Beam-forming generally refers to a process of multiplying a set of coefficients by the information symbol for transmission on multiple transmit antennas. As depicted in FIG. 3, the information symbols (32) are weighted by the vector $u =_1, [u \ldots, u_{N_t}]^T$ before transmission over $N_t$ antennas (33A-33C). The vector $u$ is thus termed a beam. Based on this convention, we can view any precoder C (21A or 21B) in FIG. 2 as a time-varying beamformer. At each time slot p, the pth row of C (denoted as $\overline{c}_p$) spreads s into $N_t$ antennas (22A-22B), and thus forming a beam direction along $\overline{c}_p$. There are a total of P different beams used for each information symbol, hence redundant time-varying beamforming.

However, the desirable C based on partial CSI has special structure. First, let us assume $\Phi = I_{N_t}$. Then, the antenna-steering vector at the pth time slot is $$\overline{c}_p = \sqrt{\delta_p} u^*_{H,p}, \quad (1.63)$$

where $u_{H,p}$ is the pth column of $U_H$ in mean feedback, or $U_h$ in covariance feedback. Notice that the $N_t$ eigenvectors coincide with the eigenvectors of the channel's correlation matrix perceived at the transmitter, $$R_H := E\{HH^H\} \quad (1.64)$$

For this reason, we term the optimal $U_H$ contains eigen beams. Then $\Delta$ can be viewed as the power loading matrix onto those eigen beams. Hence, the transmitter adopts the eigen beams in successive time slots, with proper power allocation among them.

With a general $\Phi$, each row of C is a weighted multiplexing of $N_t$ eigen-beams:

$$\overline{c}_p = \sum_{\mu=t}^{N_t} [\Phi]_{p,\mu} (\sqrt{\delta_\mu} u^H_{H,\mu}). \quad (1.65)$$

The power loading on $N_t$ eigen-beams are fixed.

In summary, the space time spreading as depected in FIG. 2 can be viewed as loaded eigen-beamforming. This explanation is extremely useful, when coupled with space time block coding (STBC).

Figure 4:
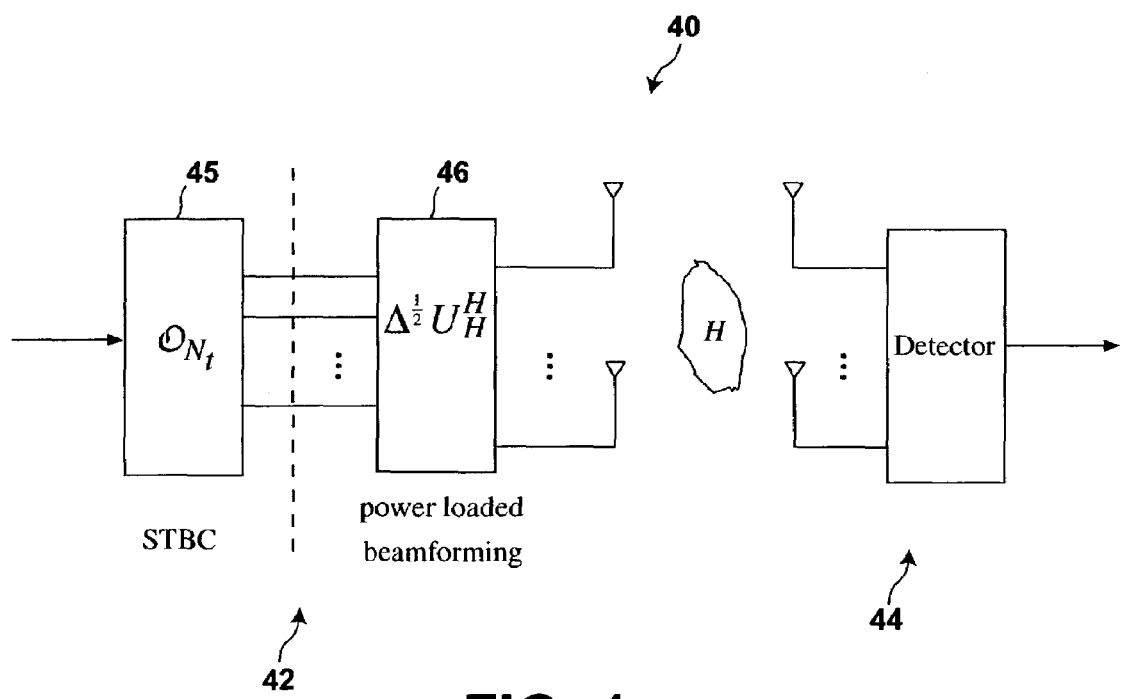
FIG. 4 is another block diagram of a space-time wireless communication system according to an embodiment of the invention.

FIG. 4 is a block diagram illustrating system 40 which includes a transmitting device (transmitter) 42 and a receiving device (receiver) 44. In particular, transmitting device 42 includes a space-time block coding unit 45 and a beam-forming unit 46 that operate according to the mathematical framework outlined below. Transmitting device 42 of FIG. 4 adopts an orthogonal STBC technique in which multiple symbols are transmitted simultaneously.

Low-rate is generally inherent to a spread-spectrum scheme. The multiantenna spread spectrum transmitter might be useful for "power-limited" (e.g., military) communication systems, where bandwidth is not at a premium but low transmission power is desired. For "bandwidth-limited" systems on the other hand, it is possible to mitigate the rate loss by sending $K > 1$ symbols, $s_1, \ldots, s_K$, simultaneously. The rate will then increase to $(K/P)$ symbols/sec/Hz. Notice that our single symbol transmission achieves good performance in an uncoded scenario, which serves as an upper-bound on the performance of multiplexed symbol transmissions. Indeed, when detecting one particular symbol $s_k$, the best scenario happens when all other symbols have been detected correctly, and their effect on $s_k$ has been perfectly cancelled.

One objective is to pursue optimal multiplexing that increases the data rate, without compromising the performance. This may require a symbol separator at the receiver, that does not incur optimality loss. But let us suppose temporarily that such a separator indeed exists, and each symbol is essentially going through separate channels. The desireable precoder $C_k$ for $s_k$ will then be $$C_k = \Phi_k \Delta^{1/2} U_H^H; \quad k = 1, 2, \ldots, K, \quad (1.66)$$

where the $\Delta$ is determined as outlined above depending on either channel mean feedback, or, covariance feedback. Because the factor $\Delta^{1/2} U_H^H$ in (1.66) is common $\forall k$, designing separable precoders is equivalent to selecting separable $\{\Phi_k\}_{k=1}^K$ matrices. Fortunately, this degree of freedom can be afforded by our design, because so far our $\Phi_k$'s are only required to have orthonormal columns.

Specifically, we can select $\Phi_k$ from all orthogonal space-time block coding (STBC) matrix. With this choice, our transmitter implements a combination of STBC followed by optimal eigen-beamforming. Here, we focus on complex constellations for brevity; the real constellations can be treated similarly.

Let $s_k^R$ and $s_k^I$ denote the real and imaginary part of $s_k$, respectively. The following orthogonal STBC designs are available for complex symbols.

Definition 1: For complex symbols $\{s_k = s_k^R + js_k^I\}_{k=1}^K$, and $P \times N_t$ matrices $\{\Phi_k, \Psi_k\}_{k=1}^K$ each having entries drawn from $\{1, 0, -1\}$, the space time coded matrix $$\mathcal{O}_{N_t} = \sum_{k=1}^K \Phi_k s_k^R + j \sum_{k=1}^K \Psi_k s_k^I \tag{1.67}$$

is termed a generalized complex orthogonal design (GCOD) in variables $\{s_k\}_{k=1}^K$ of size $P \times N_t$ and rate $K/P$, if either one of two equivalent conditions holds true:

i) $\mathcal{O}_{N_t}^H \mathcal{O}_{N_t} = (\sum_{k=1}^K |s_k|^2) I_{N_t}$, or,
ii) The matrices $\{\Phi_k, \Psi_k\}_{k=1}^K$ satisfy the conditions $$\Psi_k^H \Psi_k = I_{N_1}, \quad \Psi_k^H \Psi_k = I_{N_t}, \quad \forall k \tag{1.68}$$
$$\Psi_k^H \Psi_l = -\Phi_l^H \Phi_k, \quad \Psi_k^H \Psi_l = -\Phi_l^H \Phi_k, \quad k \neq l$$
$$\Psi_k^H \Psi_l = \Phi_l^H \Phi_k, \quad \forall k, l$$

For complex symbols $s_k = s_k^R + js_k^I$, we define two precoders corresponding to $\{\Phi_k, \Psi_k\}$ as: $C_{k,1} = \Phi_k \Delta^{1/2} U_H^H$, and $C_{k,2} = \Psi_k D_c^{1/2} U_H^H$. The combined STBC-Beamforming matrix is now $$X = \sum_{k=1}^K C_{k,1} s_k^R + j \sum_{k=1}^K C_{k,2} s_k^I = \mathcal{O}_{N_t} \Delta^{\frac{1}{2}} U_H^H. \tag{1.69}$$

The received space time matrix is:

$$Y = XH + W = \mathcal{O}_{N_t} \Delta^{1/2} U_H^H H + W. \tag{1.70}$$

Hence, the original OSTBC matrix $\mathcal{O}_{N_t}$ now sees an equivalent channel $\Delta^{1/2} U_H^H H$, as depicted in FIG. 4. By the orthogonal property of OSTBC, each symbol is equivalently passing through a scalar channel of the form $$\hat{s}_k = \|\Delta^{1/2} U_H^H H\|_F s_k + w_k. \tag{1.71}$$

The SNR is $$\gamma_k = \left\|\Delta^{\frac{1}{2}} U_H^H H\right\|_F^2 \frac{E_s}{N_0} = tr\{H^H U_H \Delta U_H^H H\} \frac{E_s}{N_0}. \tag{1.72}$$

Notice that the SNR from (1.72) is the same as that for the single symbol transmission studied in (1.16), with (1.30), thus, the optimal loading $\Delta$ enables space-time block coded transmissions to achieve the performance of single symbol transmission, but with symbol rate $K/P$. Relative to single symbol transmission, Notice that the OSTBC only have linear complexity increase, relative to the space time spreading transmission described above.

Utilizing partial channel information at the transmitter, the transmission implement a combination of orthogonal space-time block coding and eigen-beamforming (1.69). Orthogonal space time block coded transmissions are sent using $N_t$ eigen-directions, along the eigenvectors of the correlation matrix of the perceived channels at the transmitter, and are optimally power-loaded. This also justifies our eigen-beamforming interpretation described above.

For complex symbols, a rate 1 GCOD only exists for $N_t = 2$. It corresponds to the well-known Alamouti code:

$$\mathcal{O}_2 = \begin{bmatrix} s_1 & s_2 \\ -s_2^* & s_1^* \end{bmatrix} \begin{array}{l} \rightarrow \text{space} \\ \downarrow \text{time} \end{array}. \tag{1.73}$$

For $N_t = 3, 4$, rate 3/4 orthogonal STBC exist, while for $N_t > 4$, only rate 1/2 codes have been constructed. Therefore, for complex symbols, the transmitter of (1.69) achieves good performance with no rate loss only when $N_t = 2$, and pays a rate penalty up to 50%, when $N_t > 2$ and complex constellations are used. To make up for this loss, the transmitter has to enlarge the constellation size, which for the same performance necessitates more transmit-power.

To tradeoff performance for a constant rate of 1 symbol/sec/Hz, it is possible to send the Alamouti code along the strongest two eigen-beams. Specifically, we construct the $2 \times N_t$ space-time coded matrix for the 2D eigen-beamformer:

$$X = \underbrace{\begin{bmatrix} s_1 & s_2 \\ -s_2^* & s_1^* \end{bmatrix}}_{\mathcal{O}_2} \underbrace{\begin{bmatrix} \sqrt{\delta_1} & 0 \\ 0 & \sqrt{\delta_2} \end{bmatrix}}_{\Delta^{1/2}} \underbrace{[u_{H,1}, u_{H,2}]^H}_{U_o^H}. \tag{1.74}$$

With two eigen beams, the power loading parameters can be calculated with two virtual antennas. To be more specific, we list our answers as follows:

Case 1—Mean feedback: In 2D beamforming, only power splitting between two basis beams $(\delta_1, \delta_2)$ need to be specified. The solution is listed in the following.

$$\delta_1 = 1 - \delta_2, \text{ and, } \delta_2 = \begin{cases} \delta_2^0 & \frac{E_s}{N_0} > \gamma_{th,2} \\ 0 & \frac{E_s}{N_0} \leq \gamma_{th,2} \end{cases}. \tag{1.75}$$

The threshold is simplified from (1.50) with two virtual antennas:

$$\gamma_{th,2} = \frac{1}{g\sigma_\epsilon^2} \frac{(\lambda_1 - \lambda_2)(N_r \sigma_\epsilon^2 + \lambda_1)}{(N_r \sigma_\epsilon^2 + \lambda_2)(N_r \sigma_\epsilon^2 + 2\lambda_1)}. \tag{1.76}$$

And $\delta_2^0$ is obtained from (1.49) as:

$$\delta_2^0 := \frac{1 + \frac{N_r \sigma_\epsilon^2 + \lambda_1}{(N_r \sigma_\epsilon^2 + 2\lambda_1)\beta} + \frac{N_r \sigma_\epsilon^2 + \lambda_2}{(N_r \sigma_\epsilon^2 + 2\lambda_2)\beta}}{1 + \frac{(N_r \sigma_\epsilon^2 + 2\lambda_2)}{(N_r \sigma_\epsilon^2 + 2\lambda_1)} + \frac{(N_r \sigma_\epsilon^2 + \lambda_1)}{(N_r \sigma_\epsilon^2 + 2\lambda_2)^2}} - \frac{N_r \sigma_\epsilon^2 + \lambda_2}{(N_r \sigma_\epsilon^2 + 2\lambda_2)\beta} \tag{1.77}$$

The solution in (1.75) reduces to (1.52) if $N_t = 2$ and $\lambda_2 = 0$, as expected.

The threshold is simplified from (1.62) with two virtual antennas:

$$\gamma_{th,2} = \frac{1}{g}\left(\frac{1}{\lambda_2} - \frac{1}{\lambda_1}\right). \quad (1.79)$$

The optimal solution is $$\delta_2^0 = \frac{1}{2}\left[1 + \frac{N_0}{gE_s}\left(\frac{1}{\lambda_1} - \frac{1}{\lambda_2}\right)\right]. \quad (1.80)$$

Equations 1.79 and 1.80 are tailored for "Case 2," in which covariance feedback is used.

Figure 5:
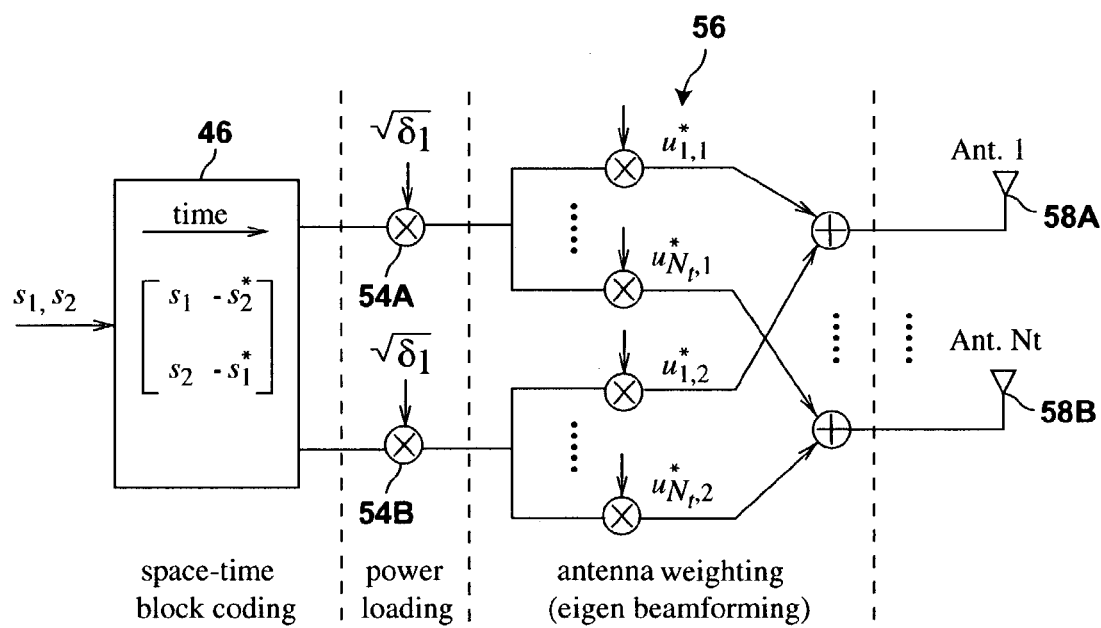
FIG. 5 is a block diagram of a transmitting device which includes a space-time block coding unit, a set of power loaders, a beam-forming unit, and a set of antennas in accordance with an embodiment of the invention.

One implementation of this 2D eigen-beam-forming unit is depicted in FIG. 5. In particular, FIG. 5 illustrates a transmitting device 50 which includes a space-time block coding unit 52, a set of power loaders 54A, 54B, a beam-forming unit 56 and a set of antennas 58A, 58B. Specifically, transmitting device 50 operates according to a mathematical framework outlined herein.

If we set $\delta_2=0$ in the 2D beamformer, we reduce (1.74) to:

$$X = \begin{bmatrix} s_1 u_{H\cdot 1}^H \\ -s_2^* u_{H\cdot 1}^H \end{bmatrix}, \quad (1.81)$$

which corresponds to transmitting information symbols $s_1$ and $-s_2^*$ in two consecutive time slots, using the conventional one-dimensional beamforming, along the strongest eigenvector.

This leads to following observation: The 2D eigen-beamformer includes the 1D-beamformer as a special case and outperforms it uniformly, without rate reduction, and without essential increase in complexity. Therefore, the 2D eigen-beamformer may be more attractive than the 1D beamformer. It is also worthwhile recalling that the 2D eigen-beamformer is generally better for systems employing $N_t=2$ transmit-antennas. Because of its full-rate capability and superior performance, the 2D eigen-beamformer may have a major impact in practical systems.

EXAMPLES

Mean Feedback

We first consider an uniform linear array with $N_t=4$ antennas at the transmitter, and a single antenna at the receiver. We consider the delayed channel feedback scenario outlined in Case 2 above, with $\sigma_h^2=1$, and a given correlation coefficient $\rho$. We will present simulation results for two constellations: QPSK (4-PSK), and 16-QAM. Simulation results are averaged over 10,000 Monte-Carlo feedback realizations.

Figure 6:
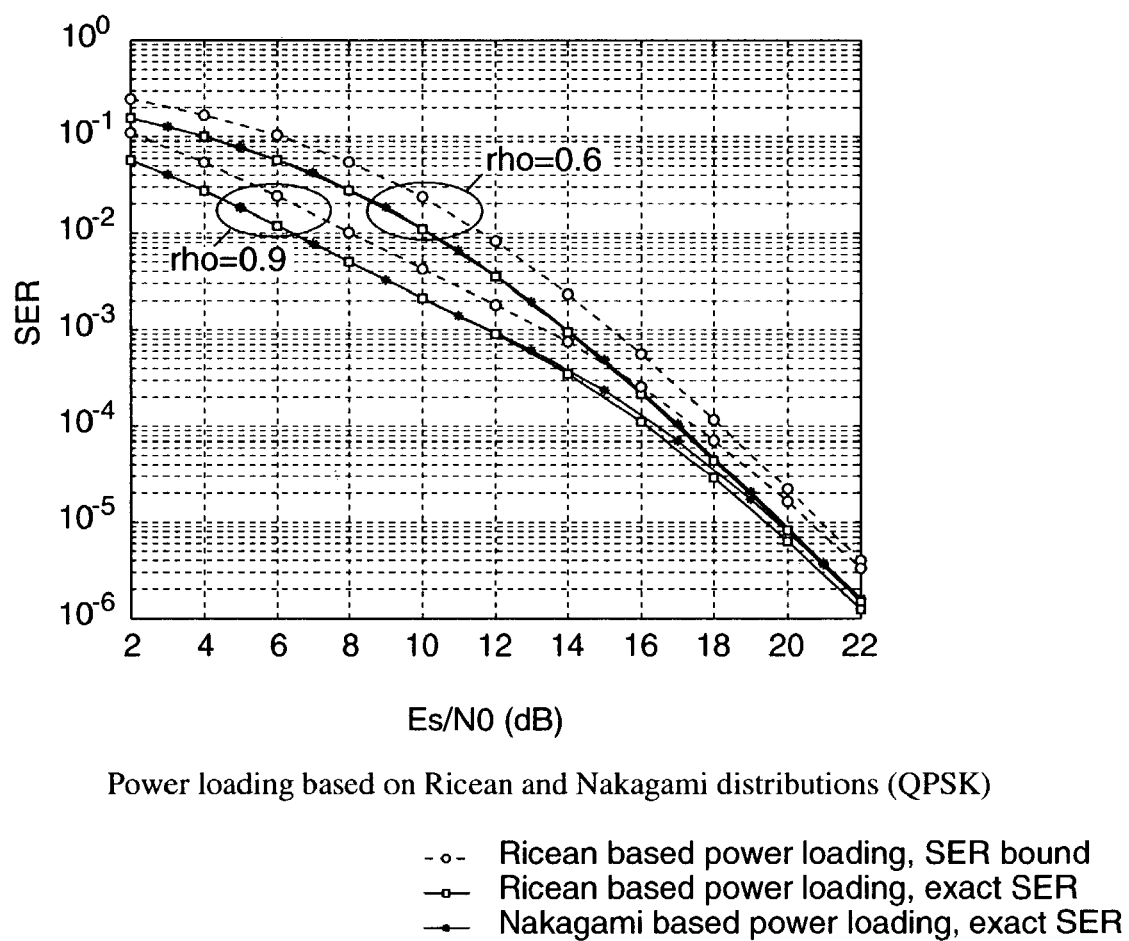
FIGS. 6-16 are graphs illustrating results of simulations of various embodiments of the invention.

We first compare optimal power loading based on the Ricean distribution (1.41) with that based on the Nakagami distribution (1.52). FIG. 6 verifies that both approaches have almost identical performance. For this reason, we subsequently plot only the performance of power loading based on (1.52). FIG. 6 also confirms that the SER bound is tight, and has a constant difference with the exact SER across the $E_s/N_0$ range considered. This justifies well our approach of pushing down the bound to decrease the SER. across the $E_s/N_0$ range considered. This justifies well our approach of pushing down the bound to decrease the SER.

Figure 7:
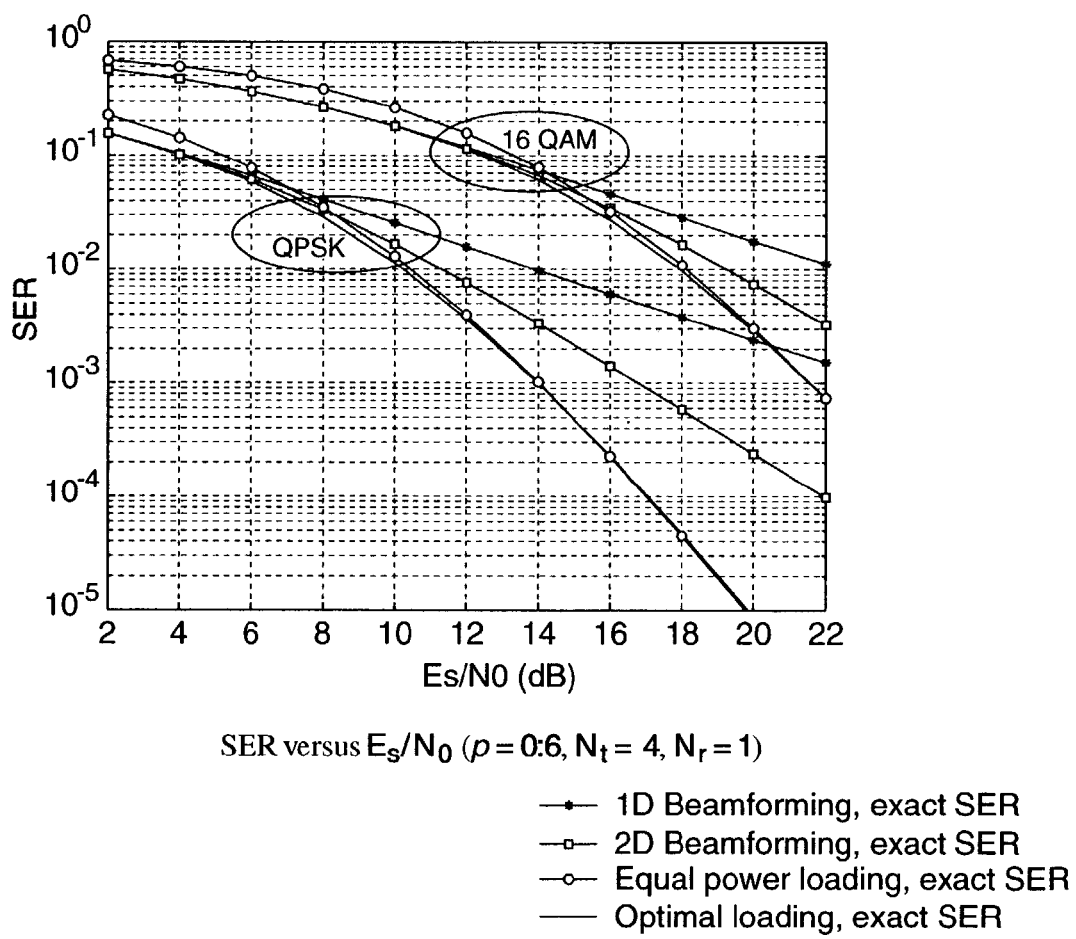
Figure 8:
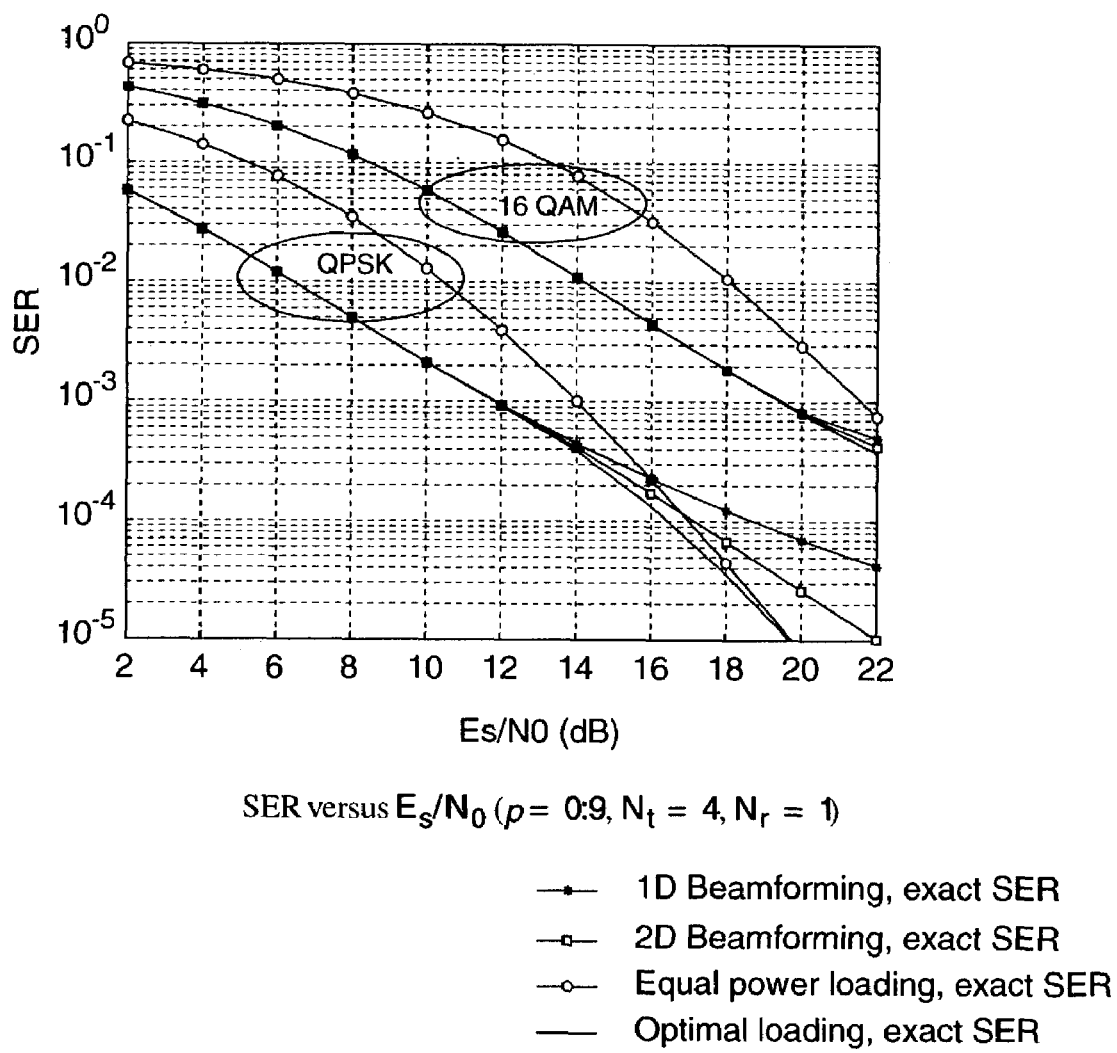

FIGS. 7 and 8 compare optimal power loading, equal power loading (that has the same performance as plain STBC without beamforming), 1D and 2D beamforming, for both QPSK and 16QAM. When the feedback quality is low ($\rho=0.6$), FIG. 7 shows that optimal power loading performs close to equal power loading, while it considerably outperforms conventional 1D beamforming. On the other hand, when the feedback quality improves to $\rho=0.9$, equal power loading is highly suboptimum. The conventional beamforming performs close to the optimal power loading at low SNR, while it becomes inferior at sufficiently high SNR. Notice that the 2D beamformer outperforms the 1D beamformer uniformly. When $E_s/N_0 > \gamma_{th}$ for each feedback realization, although both 2D and 1D beamformer become suboptimal, the 2D beamformer benefits from the order-2 diversity. Since $g_{QPSK}/g_{16QAM}=5$, we observe that 7.0 dB higher power is required for 16-QAM than QPSK, to adopt $N_t$ directions.

Figure 9:
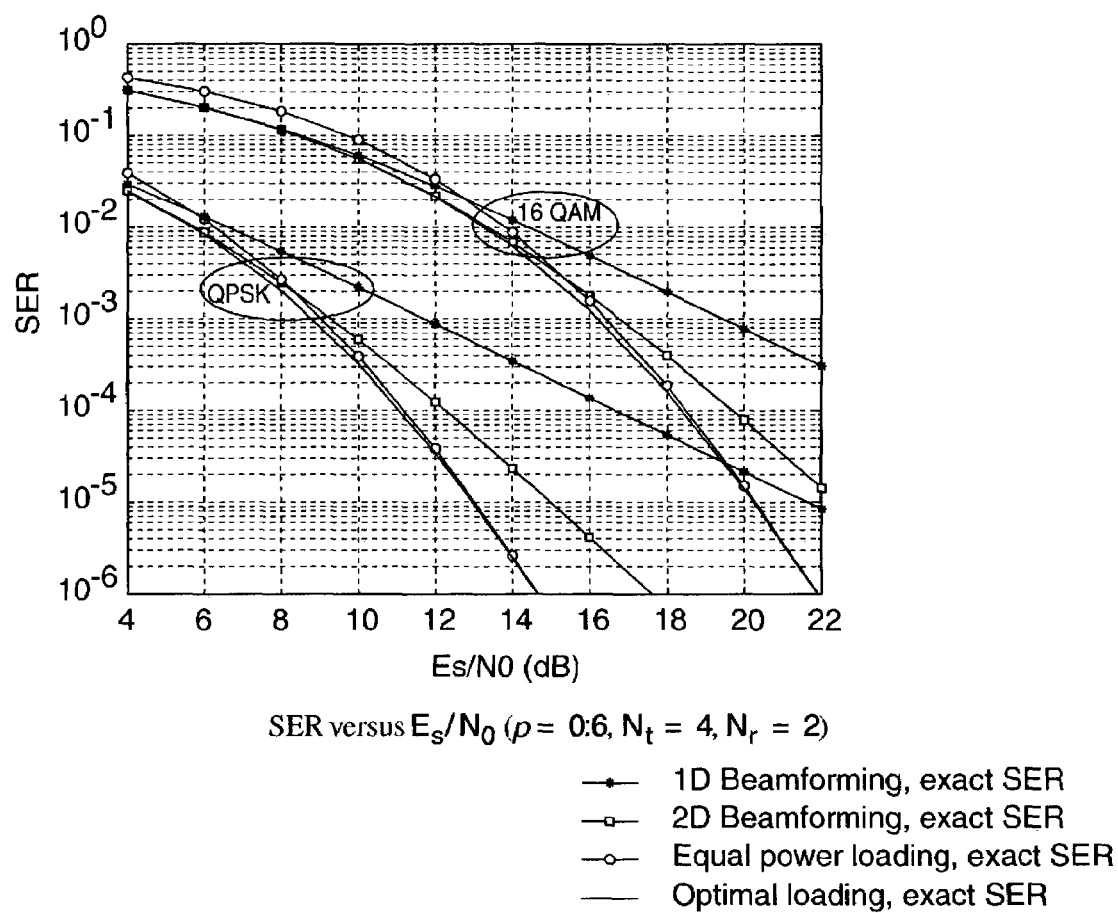
Figure 10:
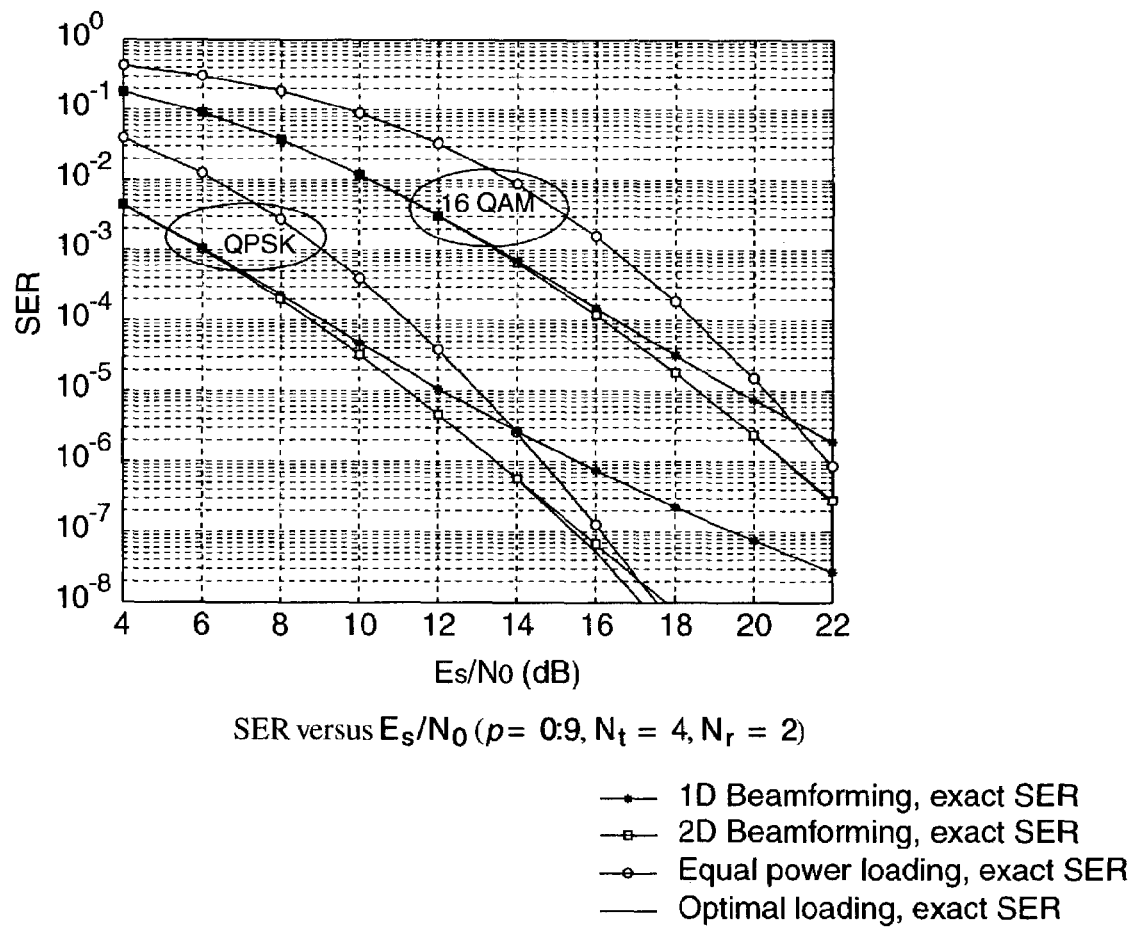

We next tested our results with multiple receive antennas. FIGS. 9 and 10 are the counterparts of FIGS. 7 and 8, but with $N_r=2$ receive antennas. It can be seen that the performance of the 2D beamformer coincides with the optimal beamformer for a larger range of $E_s/N_0$ than that of the 1D beamformer. This is different from the single receive antenna case, where 2D and 1D beamformers deviate from the optimal beamformer at the same time, since there is only one dominant direction.

Covariance Feedback

We consider a uniform linear array with $N_t=4$ antennas at the transmitter, and a single antenna at the receiver. We assume that the side information including the distance between the transmitter and the receiver, the angle of arrival, and the angle spread are all available at the transmitter. Let $\lambda$ be the wavelength of a narrowband signal, $d_t$ the antenna spacing, and $\Delta$ the angle spread. We assume that the angle of arrival is perpendicular to the transmitter antenna array. Thus, using the result of [eq. (6)] for small angle spread, we can simplify the correlation coefficient between the pth and the qth transmit-antenna as follows:

$$\left[\sum_0\right]_{p,q} \approx \frac{1}{2\pi}\int_0^{2\pi}\exp\left[-j2\pi(p-q)\Delta\frac{d_\square}{\lambda}\sin\theta\right]d\theta. \quad (1.82)$$

Our tests focus on two channels: Channel 1 has $d_t=0.5\lambda$, and $\Delta=5°$; while Channel 2 has lower spatial correlations with $d_t=0.5\lambda$, and $\Delta=25°$. Notice that $\Delta$ can be calculated from the radius of the local scatterers, and the distance between the transmitter and the receiver [3].

We present simulations for two constellations: QPSK and 16-QAM. In all the plots, the SNR is defined as the total transmitted power divided by the noise power: $SNR=E_s/N_0$.

Figure 11:
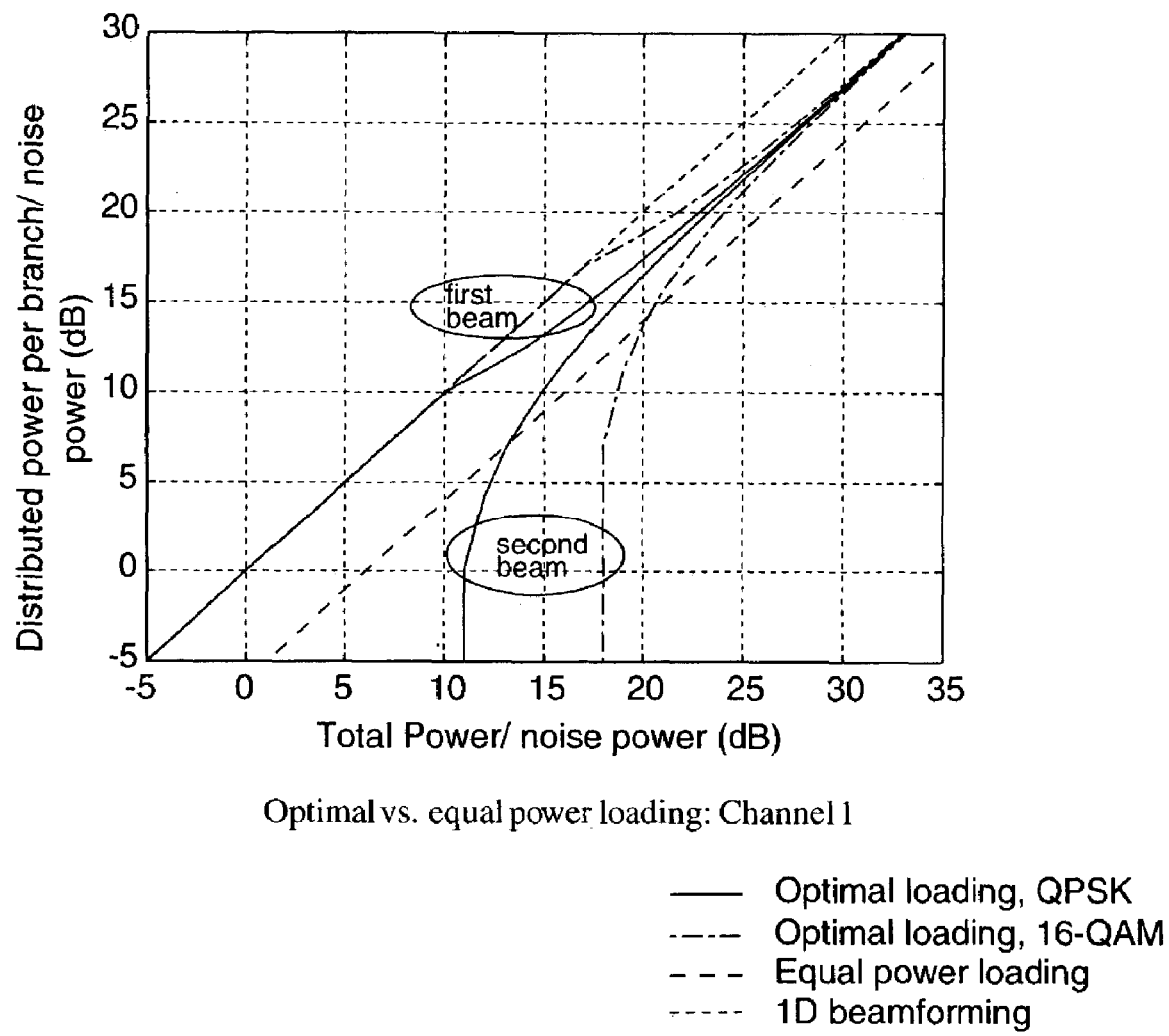
Figure 12:
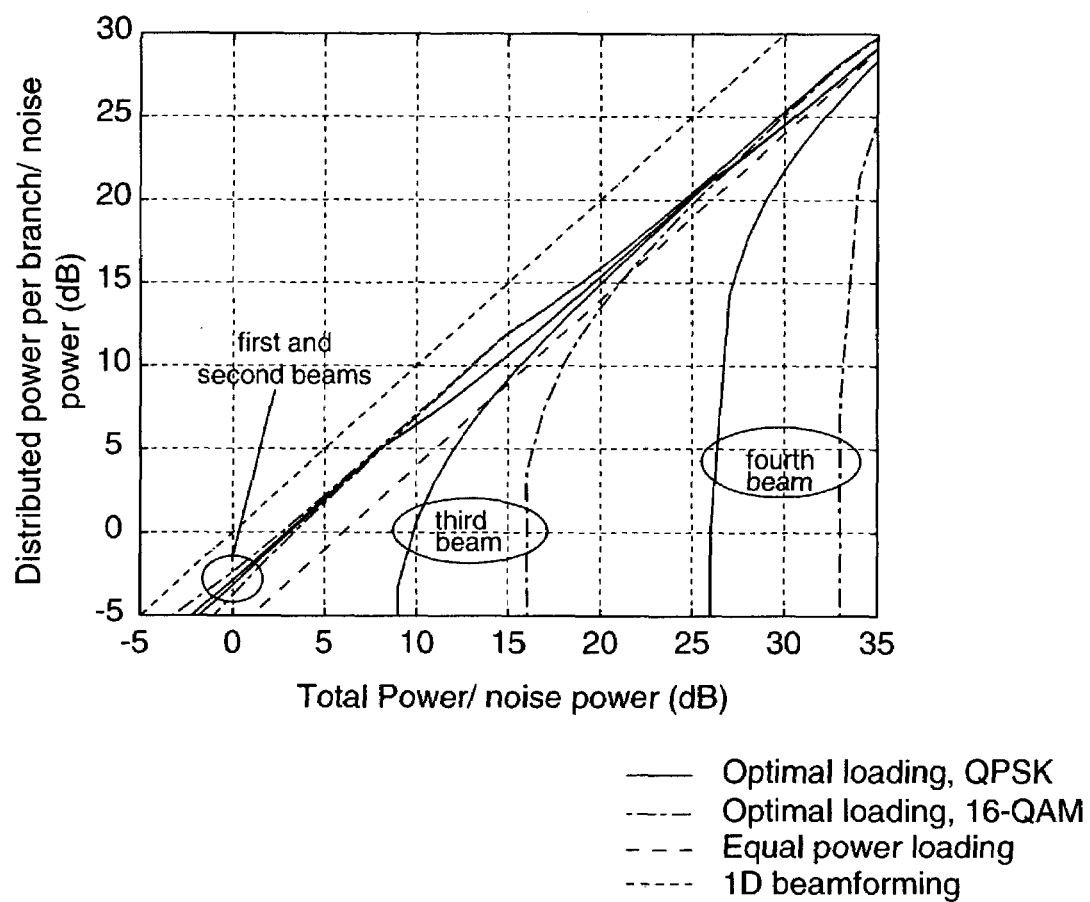

FIGS. 11 and 12 show the optimal power allocation among different beams for Channels 1 and 2, for both QPSK and QAM constellations. At low SNR, the transmitter prefers to shut off certain beams, while it approximately equates power to all antennas at sufficiently high SNR to benefit from diversity. Notice that the choice of how many beams are retained depends on the constellation-specific SNR thresholds. For QPSK, we can verify that $\gamma_{th,2}=10.2$ dB, and $\gamma_{th,3}=37.5$ dB for Channel 1, while $\gamma_{th,2}=-15.0$ dB, and $\gamma_{th,3}=8.1$ dB for Channel 2. Since $g_{QPSK}/g_{16QAM}=5$, the threshold $\gamma_{th,r}$ for 16-QAM is $10\log_{10}(5)=7.0$ dB higher for QPSK; we observe that 7.0 dB higher power is required for 16-QAM before switching to the same number of beams as for QPSK.

Figure 13:
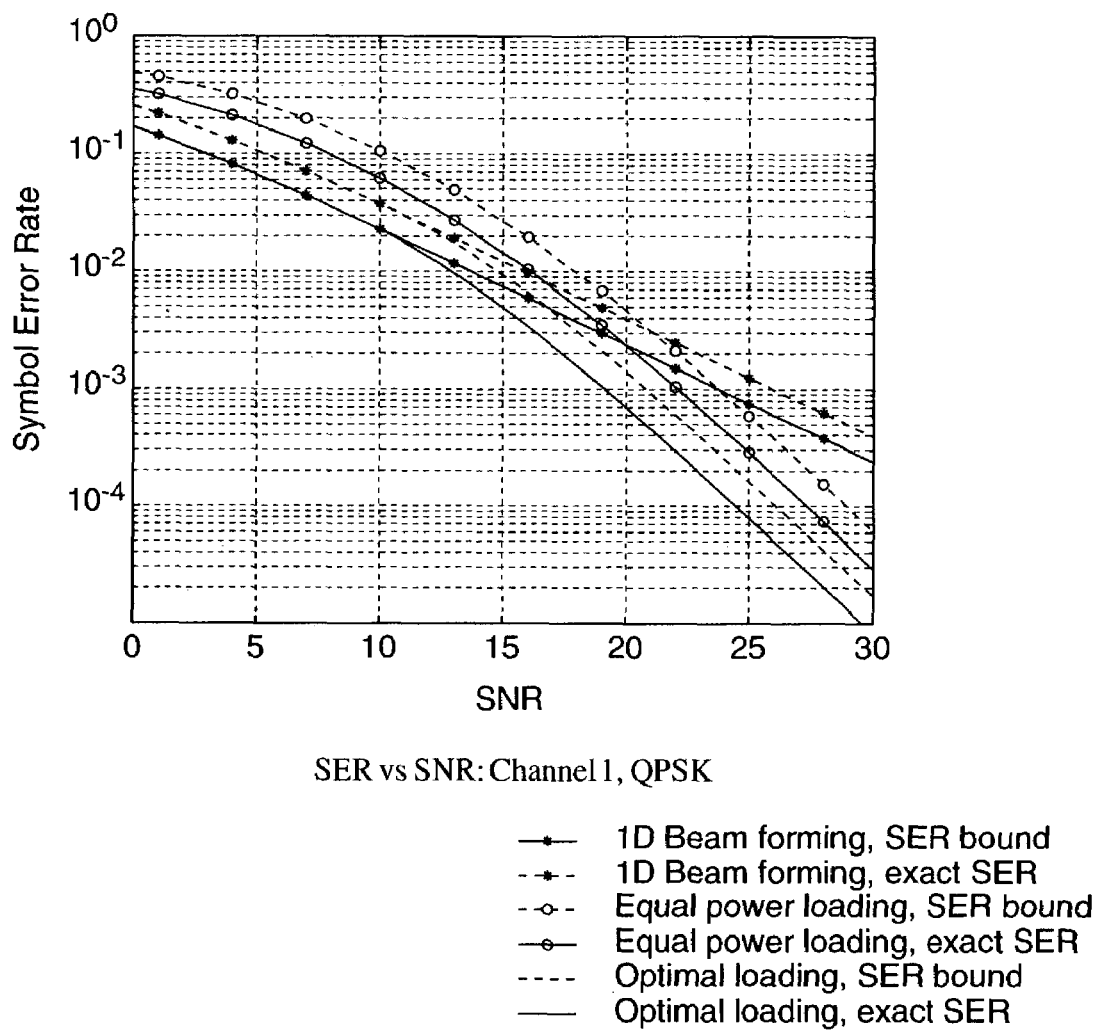
Figure 14:
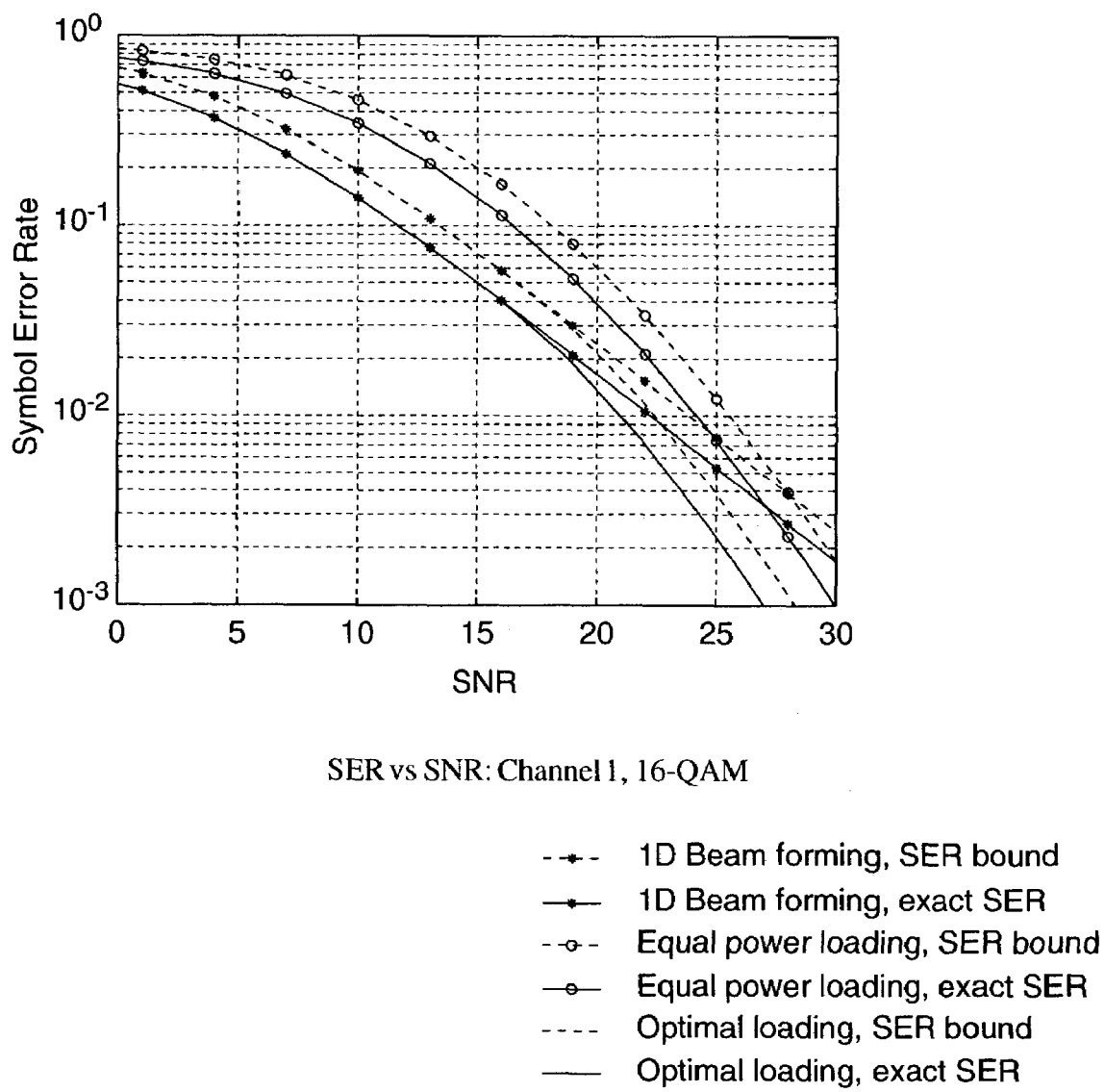

With Channel 1, FIGS. 13 and 14 depict the exact SER, and the SER upper-bound for: optimal power loading, equal power loading (that has the same performance as plain STBC without beamforming), and 1D beamforming. Since Channel 1 is highly correlated, only r=2 beams are used in the considered SNR range for optimal loading. Therefore, the 2D eigen-beamformer is overall optimal for Channel 1 in the considered SNR range, and its performance curves coincide with those of the optimal loading. FIGS. 13 and 14 confirm that the optimal allocation outperforms both the equal power allocation, and the 1D beamforming. The difference between optimal loading and equal power loading is about 3 dB as SNR increases, since 2 out of 4 beams are so weak that the power allocated to them is wasted. The differences between the upper-bound and the exact SER in FIGS. 13 and 14 justify our approach that pushes down the upper-bound to minimize the exact SER.

Figure 15:
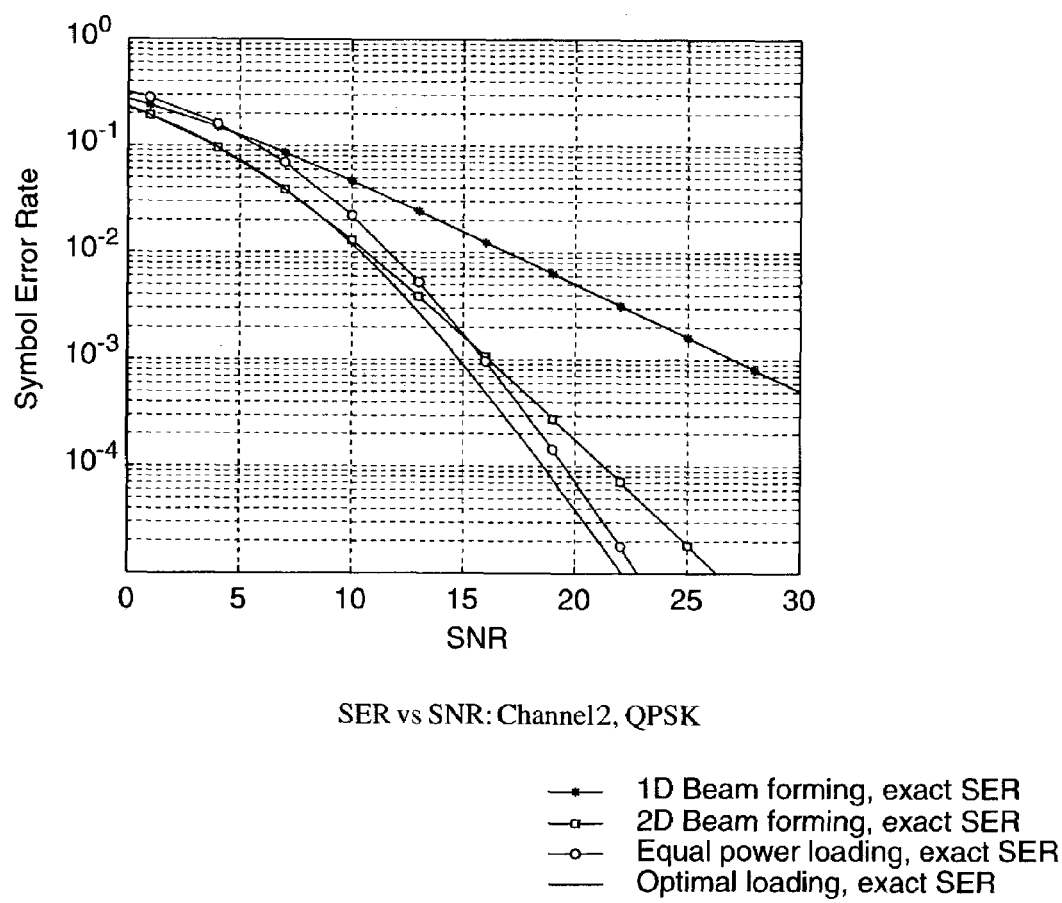
Figure 16:
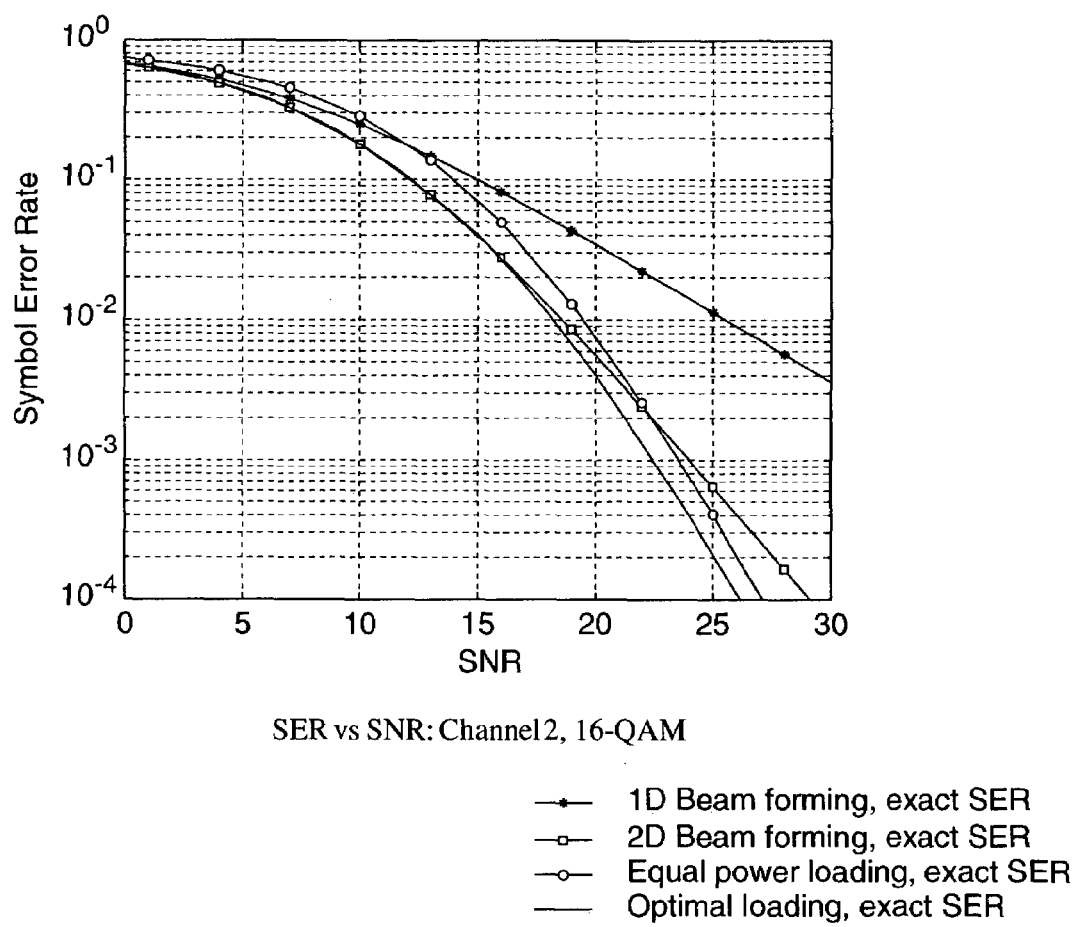

On the other hand, Channel 2 is less correlated than Channel 1, and all four beams are used at high SNR. Equal power loading approaches the optimal loading when SNR is sufficiently high, but is inferior to both the 2D eigen-beamforming and the optimal loading at low to medium SNR, as confirmed by FIGS. 15 and 16. It is also shown that 2D eigen-beamforming outperforms 1D beamforming uniformly, and the difference is quite significant at moderate to high SNR. By checking the eigenvalues of Channel 2, we find that $D_{h=diag}$ (1.79, 1.74, 0.45, 0.02). Notice that the first two eigenvalues are not disparate enough, and the 1D beamformer is only optimal when $E_s/N_0 \leq \gamma_{th,2} = -8.0$ dB for 16-QAM. On the other hand, the 2D eigen-beamformer achieves optimality up to $E_s/N_0 = \gamma_{th,3} = 15.1$ dB for 16-QAM, as seen in FIG. 16. This observation corroborates the importance of 2D eigen-beamforming relative to 1D beamforming.

Various embodiments of the invention have been described. Nevertheless, various modifications can be made, without departing from the spirit and scope of the invention. For example, other mathematical techniques may be used in the feedback scheme, such as the median value associated with the channels, or the standard deviation associated with the mean channel value. Also, certain aspects of the invention may find use in systems that do not necessarily implement multiple transmit antennas. For example, the techniques have been described above in the context of multiple transmit antennas that define multiple antennas. However, in some cases, a given transmit antenna can define a multi-path signal. In that case, each reception of the multi-path signal can be viewed as a channel. In accordance with the invention, the techniques described herein can also be used to estimate channel information associated with multiple channels of a multi-path signal, and then feed back the estimated channel information for use in generating subsequent signals. In other words, in some embodiments of the invention, a single transmit antenna can be used to create multi-path signals, for which channel information is estimated and feed back to the transmitter for use in generating subsequent signals. Also, in some cases, the transmitter can have multiple transmit antennas, with each antenna sending multi-path signals. In other words, the invention can also apply with multiple transmit antenna channels having a plurality of multi-path channels for each antenna.

The described techniques can be embodied in a variety of transmitters including base stations, cell phones, laptop computers, handheld computing devices, personal digital assistants (PDA's), and the like. The devices may include a digital signal processor (DSP), field programmable gate array (FPGA), application specific integrated circuit (ASIC) or similar hardware, firmware and/or software for implementing the techniques. In other words, block coding units and Eigen-beam-forming unit, as described herein, may be implemented in such hardware, software, firmware, or the like.

If implemented in software, a computer readable medium may store computer readable instructions, i.e., program code, that can be executed by a processor or DSP to carry out one of more of the techniques described above. For example, the computer readable medium may comprise random access memory (RAM), read-only memory (ROM), non-volatile random access memory (NVRAM), electrically erasable programmable read-only memory (EEPROM), flash memory, or the like. The computer readable medium may comprise computer readable instructions that when executed in a wireless communication device, cause the wireless communication device to carry out one or more of the techniques described herein. These and other embodiments are within the scope of the following claims.

The invention claimed is:

1. A method comprising:
receiving estimated channel information for a space-time wireless communication system;
coding signals for transmission by a multiple antenna transmitter based on the estimated channel information, wherein coding the signals comprises selecting symbols based on the estimated channel information;
forming Eigen-beams, with a two-dimensional Eigen-beam-forming unit, based on the selected symbols and the estimated channel information, wherein forming the Eigen-beams comprises applying the following:

$$X = \sum_{k=1}^{K} C_{k,1} s_k^R + j \sum_{k=1}^{K} C_{k,2} s_k^I = O_{N_i} \Delta^{\frac{1}{2}} U_H^H; \text{ and}$$

sending the selected symbols via multiple antennas, wherein sending the selected symbols comprises sending the Eigen-beams via the multiple antennas.

2. The method of claim 1, wherein receiving estimated channel information comprises receiving information defining a mean estimate of multiple channels associated with the multiple antennas.

3. The method of claim 2, further comprising identifying that the channels are substantially slow time-varying channels.

4. The method of claim 1, wherein receiving estimated channel information comprises receiving a perturbation vector defining uncertainties of the channels relative to a nominal vector that nominally defines the channels.

5. The method of claim 1, wherein receiving estimated channel information comprises receiving information defining a covariance estimate of multiple channels associated with the multiple antennas.

6. The method of claim 5, further comprising identifying that the channels are substantially rapid time-varying channels.

7. The method of claim 1, wherein receiving estimated channel information comprises receiving information defining a mean estimate of multiple channels associated with the multiple antennas and receiving information defining a covariance estimate of the multiple channels.

8. The method of claim 7, further comprising:
identifying that the channels are substantially slow time-varying channels; and
coding signals for transmission by the multiple antenna transmitter using the mean estimate.

9. The method of claim 7, further comprising:
identifying that the channels are substantially rapid time-varying channels; and
coding signals for transmission by the multiple antenna transmitter using the covariance estimate.

10. The method of claim 1, wherein the method is performed by one of a wireless mobile device and a wireless base station.

11. A wireless device comprising:
a coding unit to select symbols based on received channel information estimated for a space-time wireless communication system;
multiple transmit antennas to send the symbols; and
a two-dimensional Eigen-beam-forming unit to form Eigen-beams based on the selected symbols and the received channel information, wherein the multiple transmit antennas send the symbols by sending the Eigen-beams. and wherein the two-dimensional Eigen-beam-forming unit forms Eigen-beams by applying the following:

$$X = \sum_{k=1}^{K} C_{k,1} s_k^R + j \sum_{k=1}^{K} C_{k,2} s_k^I = O_{N_t} \Delta^{\frac{1}{2}} U_H^H.$$

12. The wireless device of claim 11, wherein the coding unit applies a block coding matrix:

$$O_{N_t} = \sum_{k=1}^{K} \Phi_k s_k^R + j \sum_{k=1}^{K} \Psi_k s_k^I$$

where $s_k^R$ and $s_k^I$ denote the real and imaginary parts of symbol $s_k$, $N_t$ denotes the number of antennas, and for complex symbols $\{s_k = s_k^R + j s_k^I\}_{k=1}^{K}$, the matrices $\{\Phi_k, \Psi_k\}_{k=1}^{K}$ each have entries drawn from $\{1, 0, -1\}$.

13. The wireless device of claim 12, wherein the following condition holds true:

$$O_{N_t}^H O_{N_t} = \left( \sum_{k=1}^{K} |s_k|^2 \right) I_{N_t}$$

where the superscript H denotes Hermitian transpose, $N_t$ denotes the number of transmit antennas, and $s_k$ denotes a symbol.

14. The wireless device of claim 11 wherein the two-dimensional Eigen-beam-forming unit forms the Eigen-beams by applying the following:

$$X = \underbrace{\begin{bmatrix} s_1 & s_2 \\ -s_2^* & s_1^* \end{bmatrix}}_{O_2} \underbrace{\begin{bmatrix} \sqrt{\delta_1} & 0 \\ 0 & \sqrt{\delta_2} \end{bmatrix}}_{\Delta^{\frac{1}{2}}} \underbrace{\begin{bmatrix} u_{H,1}, u_{H,2} \end{bmatrix}^H}_{U_s^H}$$

where s denotes symbols, $\delta_1$ and $\delta_2$ denote power loading on two Eigen-beams, the superscript H denotes Hermitian transpose and u1 and u2 denote the two Eigen-beams.

15. The wireless device of claim 14, wherein:

$$\delta_1 = 1 - \delta_2, \text{ and, } \delta_2 = \begin{cases} \delta_2^0 & \frac{E_s}{N_{\bar{u}}} > \gamma_{th,2} \\ 0 & \frac{E_p}{N_{\bar{u}}} \leq \gamma_{th,2} \end{cases}$$

where $E_s$ denotes the symbol energy, $N_0$ denotes the noise variance and $\gamma_{th}$ denotes the threshold on $E_s/N_0$ above which two beams are used and below which only one beam is used.

16. The wireless device of claim 11, wherein the received channel information estimated for the space-time wireless communication system includes a mean estimate of multiple channels associated with the multiple transmit antennas.

17. The wireless device of claim 11, wherein the received channel information estimated for the space-time wireless communication system includes a perturbation vector defining uncertainties of the channels relative to a nominal vector that nominally defines the channels.

18. The wireless device of claim 11, wherein the received channel information estimated for the space-time wireless communication system includes a covariance estimate of multiple channels associated with the multiple transmit antennas.

19. The wireless device of claim 11, wherein the device comprises one of a wireless mobile device and a wireless base station.

20. A computer readable medium comprising computer readable instructions that when executed in a wireless device cause the device to:
code signals for transmission by a multiple antenna transmitter in a space-time wireless communication system based on received channel information estimated by a receiving device, wherein the instructions that cause the device to code the signals comprise instructions that cause the device to select symbols based on the received channel information;
form Eigen-beams, with a two-dimensional Eigen-beam-forming unit, based on the selected symbols and the received channel information, wherein the instructions that cause the device to form the Eigen-beams comprise instructions that cause the device to apply the following:

$$X = \sum_{k=1}^{K} C_{k,1} s_k^R + j \sum_{k=1}^{K} C_{k,2} s_k^I = O_{N_t} \Delta^{\frac{1}{2}} U_H^H; \text{ and}$$

send the selected symbols via multiple antennas, wherein the instructions that cause the device to send the selected symbols comprise instructions that cause the device to send the Eigen-beams via the multiple antennas.

21. The computer readable medium of claim 20, wherein the channel information includes a mean estimate of multiple channels associated with the multiple antennas.

22. The computer readable medium of claim 20, wherein the channel information includes a perturbation vector defining uncertainties of the channels relative to a nominal vector that nominally defines the channels.

23. The computer readable medium of claim 20, wherein the channel information includes a covariance estimate of multiple channels associated with the multiple antennas.

24. A wireless device comprising:
means for receiving estimated channel information for a space-time wireless communication system; and means for coding signals for transmission by a multiple antenna transmitter based on the estimated channel information, wherein the means for coding the signals comprises means for selecting symbols based on the estimated channel information;

means for forming Eigen-beams, with a two-dimensional Eigen-beam-forming unit, based on the selected symbols and the estimated channel information, wherein the means for forming the Eigen-beams comprises means for applying the following:

$$X = \sum_{k=1}^{K} C_{k,1} s_k^R + j \sum_{k=1}^{K} C_{k,2} s_k^I = O_{N_t} \Delta^{\frac{1}{2}} U_H^H; \text{ and}$$

means for sending the selected symbols via multiple antennas, wherein the means for sending the selected symbols comprises means for sending the Eigen-beams via the multiple antennas.

25. The wireless device of claim 24, wherein the estimated channel information includes a mean estimate of the multiple channels associated with the multiple antennas.

26. The wireless device of claim 24, wherein the estimated channel information includes a perturbation vector defining uncertainties of the channels relative to a nominal vector that nominally defines the channels.

27. The wireless device of claim 24, wherein the estimated channel information includes a covariance estimate of multiple channels associated with the multiple antennas.

28. A space-time wireless communication system comprising:
a first wireless device that estimates channel information based on a received signal and transmits the channel information;
a second wireless device that receives the estimated channel information from the first wireless device and codes signals for subsequent transmission via multiple transmit antennas based on the estimated channel information, wherein the second wireless device codes the signals by selecting symbols based on the estimated channel information; and
a two-dimensional Eigen-beam-forming unit that forms Eigen-beams based on the selected symbols and the estimated channel information, wherein the multiple transmit antennas send the symbols by sending the Eigen-beams, and wherein the two-dimensional Eigen-beam-forming unit forms Eigen-beams by applying the following:

$$X = \sum_{k=1}^{K} C_{k,1} s_k^R + j \sum_{k=1}^{K} C_{k,2} s_k^I = O_{N_t} \Delta^{\frac{1}{2}} U_H^H.$$

29. The space-time wireless communication system 28, wherein the estimated channel information includes a mean estimate of multiple channels associated with the multiple transmit antennas.

30. The space-time wireless communication system 28, wherein the estimated channel information includes a perturbation vector defining uncertainties of channels relative to a nominal vector that nominally defines the channels.

31. The space-time wireless communication system 28, wherein the estimated channel information includes a covariance estimate of multiple channels associated with the multiple transmit antennas.

32. A method comprising:
receiving communications from a transmitting device via multiple communication channels associated with multiple transmit antennas of the transmitting device;
computing estimated channel information for the multiple channels; and
communicating the estimated channel information to the transmitting device to control coding of signals for transmission by the multiple transmit antennas, wherein the transmitting device selects symbols based on the estimated channel information, and forms Eigen-beams, with a two-dimensional Eigen-beam-forming unit, based on the selected symbols and the estimated channel information, wherein the multiple transmit antennas send the selected symbols by sending the Eigen-beams, and wherein the transmitting device forms the Eigen-beams by applying the following:

$$X = \sum_{k=1}^{K} C_{k,1} s_k^R + j \sum_{k=1}^{K} C_{k,2} s_k^I = O_{N_t} \Delta^{\frac{1}{2}} U_H^H.$$

33. The method of claim 32, wherein the estimated channel information includes a mean estimate of multiple channels associated with the multiple transmit antennas.

34. The method of claim 32, wherein the estimated channel information includes a perturbation vector defining uncertainties of the channels relative to a nominal vector that nominally defines the channels.

35. The method of claim 32, wherein the estimated channel information includes a covariance estimate of multiple channels associated with the multiple transmit antennas.

36. A wireless device comprising:
means for estimating channel information for a space-time wireless communication system; and
means for communicating the estimated channel information to a transmitter for use in transmitting subsequent signals by multiple antennas, wherein the transmitter selects symbols based on the estimated channel information, and forms Eigen-beams, with a two-dimensional Eigen-beam-forming unit, based on the selected symbols and the estimated channel information, wherein the multiple antennas send the selected symbols by sending the Eigen-beams, and wherein the transmitter forms the Eigen-beams by applying the following:

$$X = \sum_{k=1}^{K} C_{k,1} s_k^R + j \sum_{k=1}^{K} C_{k,2} s_k^I = O_{N_t} \Delta^{\frac{1}{2}} U_H^H.$$

37. The wireless device of claim 36, wherein the estimated channel information includes a mean estimate of the multiple channels associated with the multiple antennas.

38. The wireless device of claim 36, wherein the estimated channel information includes a perturbation vector defining uncertainties of the channels relative to a nominal vector that nominally defines the channels.

39. The wireless device of claim 36, wherein the estimated channel information includes a covariance estimate of multiple channels associated with the multiple antennas.

40. A method comprising:
receiving estimated channel information associated with multiple channels of a wireless communication signal; and
coding subsequent signals for transmission based on the estimated channel information, wherein coding the subsequent signals comprises selecting symbols based on the estimated channel information;
forming Eigen-beams, with a two-dimensional Eigen-beam-forming unit, based on the selected symbols and the estimated channel information, wherein forming the Eigen-beams comprises applying the following:

$$X = \sum_{k=1}^{K} C_{k,1} s_k^R + j \sum_{k=1}^{K} C_{k,2} s_k^I = O_{N_t} \Delta^{\frac{1}{2}} U_H^H; \text{ and}$$

sending the selected symbols via multiple transmit antennas, wherein sending the selected symbols comprises sending the Eigen-beams via the multiple transmit antennas.

41. The method of claim 40, wherein receiving estimated channel information comprises receiving information defining a mean estimate of the multiple channels.

42. The method of claim 40, wherein receiving estimated channel information comprises receiving information defining a covariance estimate of multiple channels.

43. The method of claim 40, wherein the multiple channels include channels associated with multiple transmit antennas.

44. The method of claim 40, wherein the multiple channels include channels of a multi-path signal associated with a transmit antenna.

* * * * *

UNITED STATES PATENT AND TRADEMARK OFFICE
CERTIFICATE OF CORRECTION

PATENT NO. : 7,522,673 B2
APPLICATION NO. : 10/420351
DATED : April 21, 2009
INVENTOR(S) : Giannakis et al.

It is certified that error appears in the above-identified patent and that said Letters Patent is hereby corrected as shown below:

In the Specification

Column 1, line 17, "and Contract No. DAAD19 01-2-0011" should read

-- and Contract No. DAAD19-01-2-001 --

Column 8, line 45, "exp (-$h^{-H}$ $g^z$[lsin$^2$" should read -- exp(-$h^{-H}$ gZ[Isin$^2$ --

Column 8, line 52, "$b_{QAM}$" should read -- +$b_{QAM}$ --

Column 9, line 16, "argmin $P_s$" should read -- argmin $P_8$ --

Column 9, line 26, "Notice that as long as P $\geqq N_t$" should read

-- Notice that as long as P≥$N_t$ --

Column 8, line 66, "$P_{s,bound}$" should read -- $P_{8,bound}$ --

Column 9, line 7, "$P_{s,bound}$" should read -- $P_{8,bound}$ --

Column 9, line 15, "$P_{s,bound}$" should read -- $P_{8,bound}$ --

Column 9, line 54, "$P_{s,bound}$" should read -- $P_{8,bound}$ --

Column 9, line 63, " $\lambda_1 \geqq \lambda_2 \geqq ... \geqq \lambda_{Nt}$ " should read -- $\lambda_1 \geq \lambda_2 \geq ... \geq \lambda_{N_t}$ --

Column 10, line 5, "$P_{s,bound}$" should read -- $P_{8,bound}$ --

Signed and Sealed this
Thirtieth Day of September, 2014

Michelle K. Lee
*Deputy Director of the United States Patent and Trademark Office*

CERTIFICATE OF CORRECTION (continued)
U.S. Pat. No. 7,522,673 B2

Column 10, line 25, "$\Delta \geqq 0$" should read -- $\Delta \geq 0$ --

Column 11, line 13, "$P_{s,bound} \approx \tilde{P}_{s,bound}$" should read -- $P_{8,bound} \approx \tilde{P}_{8,bound}$ --

Column 11, line 20, "$\ln \tilde{P}_{s,bound}$" should read -- $\ln \tilde{P}_{8,bound}$ --

Column 11, line 28, "$\Delta \geqq 0$" should read -- $\Delta \geq 0$ --

Column 11, line 40, "$\mu \geqq \bar{N}_t + 1$" should read -- $\mu \geq \bar{N}_t + 1$ --

Column 12, line 34, "$P_{s,bound}...E_s$" should read -- $P_{8,bound}...E_8$ --

Column 12, line 42, "$\lambda_\mu \geqq 0$," should read -- $\lambda_\mu \geq 0$ --

Column 12, line 44, "$\lambda_1 Dh ... \geqq \lambda_{N_t} \geqq 0$" should read -- $\lambda_1 \geq \cdots \geq \lambda_{N_t} \geq 0$ --

Column 12, line 49, "$P_{s,bound}....E_s$" should read -- $P_{8,bound}...E_8$ --

Column 12, line 61, "$\varepsilon_g := \ln P_{s,bound} =$" should read -- $\varepsilon_3 := \ln P_{8,bound} =$ --

Column 12, line 63, "$E_s$" should read -- $E_8$ --

Column 13, line 4, "$\Delta \geqq 0$" should read -- $\Delta \geq 0$ --

Column 13, line 64, "$E\{HH^H\}$" should read -- $E\{\tilde{H}\tilde{H}^H\}$ --

Column 15, line 18, "$\Psi_K^H \Psi$" should read -- $\Phi_K^H \Phi$ --

Column 15, line 20, "$\Psi_K^H \Psi_1 = \Phi_K^H \Phi_k$" should read -- $\Phi_K^H \Psi_1 = \Psi_K^H \Phi_k$ --

Column 15, line 22, "$\Psi_K^H \Psi_1 = \Phi_K^H \Phi_k$" should read -- $\Phi_K^H \Psi_1 = \Psi_K^H \Phi_k$ --

Column 18, line 43, "d" should read -- $d_t$ --

Column 19, line 26, "$D_{h=diag}$" should read -- $D_h = diag$ --

Column 19, line 29, "$N_0 \leqq Y_{th,2}$" should read -- $N_0 \leq Y_{th,2}$ --

CERTIFICATE OF CORRECTION (continued)
U.S. Pat. No. 7,522,673 B2

In the Claims

Column 21, line 38 (Claim 12), "$_{\text{I denote the real and imaginary parts of symbol s}}$" should read -- I denote the real and imaginary parts of symbol $_s$ --

Column 21, line 62 (claim 14), "$U(_s^H)$" should read -- $U(_c^H)$ --

Column 22, line 5 (claim 15), "$N_{\tilde{U}}$" should read -- $N_0$ --

Column 22, line 47 (claim 20), "$O_{Ni}$" should read -- $O_{Nt}$ --

Column 23, line 14 (claim 24), "$O_{Ni}$" should read -- $O_{Nt}$ --

Column 25, line 15 (claim 40), "$O_{Ni}$" should read -- $O_{Nt}$ --